(12) United States Patent
Hopper et al.

(10) Patent No.: US 8,878,295 B2
(45) Date of Patent: Nov. 4, 2014

(54) DMOS TRANSISTOR WITH A SLANTED SUPER JUNCTION DRIFT STRUCTURE

(75) Inventors: Peter J. Hopper, San Jose, CA (US); Alexei Sadovnikov, Sunnyvale, CA (US); William French, San Jose, CA (US); Erika Mazotti, San Martin, CA (US); Richard Wendell Foote, Jr., Burleson, TX (US); Punit Bhola, South Portland, ME (US); Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 356 days.

(21) Appl. No.: 13/086,187

(22) Filed: Apr. 13, 2011

(65) Prior Publication Data

US 2012/0261753 A1    Oct. 18, 2012

(51) Int. Cl.
*H01L 29/66*    (2006.01)
(52) U.S. Cl.
USPC ........... 257/343; 257/328; 257/329; 257/335; 257/342; 257/559; 257/E29.027; 257/E29.256; 257/E29.26
(58) Field of Classification Search
CPC ................ H01L 29/41766; H01L 29/0634; H01L 29/7809
USPC ............ 257/328, 329, 342, E29.26, E29.257, 257/E29.027, E29.066, E29.256, E21.418, 257/335, 559
See application file for complete search history.

(56) References Cited

U.S. PATENT DOCUMENTS

| | | | | |
|---|---|---|---|---|
| 5,539,238 A * | 7/1996 | Malhi | ........................ | 257/510 |
| 5,701,026 A * | 12/1997 | Fujishima et al. | ............ | 257/510 |
| 6,097,063 A * | 8/2000 | Fujihira | ........................ | 257/342 |
| 6,184,555 B1 * | 2/2001 | Tihanyi et al. | ................ | 257/342 |
| 6,740,931 B2 * | 5/2004 | Kouzuki et al. | ................ | 257/341 |
| 6,773,995 B2 * | 8/2004 | Shin et al. | ...................... | 438/270 |
| 7,573,100 B2 * | 8/2009 | Ko | ................ | 257/339 |
| 7,767,528 B2 * | 8/2010 | Muller et al. | .................. | 438/270 |
| 8,319,284 B2 * | 11/2012 | Lin et al. | ....................... | 257/343 |
| 8,455,942 B2 * | 6/2013 | Park | ............................... | 257/330 |
| 2002/0149051 A1 | 10/2002 | Kinzer et al. | | |
| 2005/0029222 A1 | 2/2005 | Chen | | |
| 2008/0111207 A1 * | 5/2008 | Lee et al. | ...................... | 257/496 |
| 2008/0258226 A1 | 10/2008 | Ishiguro | | |
| 2009/0218620 A1 | 9/2009 | Herbert et al. | | |

OTHER PUBLICATIONS

Sugi, A. et al., "Super Junction MOSFETs above 600V with Parallel Gate Structure Fabricated by Deep Trench Etching and Epitaxial Growth", Proceedings of the 20th International Symposium on Power Semiconductor Devices & ICs, 2008, pp. 165-168.
Chen, W. et al., "Realizing high voltage SJ-LDMOS with non-uniform N-buried layer", Solid State Electronics 52, 2008, pp. 675-678.

* cited by examiner

*Primary Examiner* — Matthew W. Such
*Assistant Examiner* — Jesse Y Miyoshi
(74) *Attorney, Agent, or Firm* — Eugene C. Conser; Frederick J. Telecky, Jr.

(57) ABSTRACT

A DMOS transistor with a lower on-state drain-to-source resistance and a higher breakdown voltage utilizes a slanted super junction drift structure that lies along the side wall of an opening with the drain region at the bottom of the opening and the source region near the top of the opening.

9 Claims, 23 Drawing Sheets

DMOS TRANSISTOR WITH A SLANTED SUPER JUNCTION DRIFT STRUCTURE

BACKGROUND OF THE INVENTION

1. Field of the Invention

The present invention relates to DMOS transistors and, more particularly, to a DMOS transistor with a slanted super junction drift structure.

2. Description of the Related Art

A metal-oxide-semiconductor (MOS) transistor is a well-known device that has heavily-doped source and drain semiconductor regions which are separated by a lightly-doped channel semiconductor region of the opposite conductive type. The MOS transistor also has an oxide layer that lies over the channel semiconductor region, and a metal gate that touches the oxide layer and lies over the channel semiconductor region. In addition to metal, the gate of a MOS transistor is also commonly formed with doped polysilicon.

A double-diffused MOS (DMOS) transistor is a power transistor that has a large lightly-doped drain semiconductor region, known as a drift region, which touches the channel semiconductor region and typically lies between the channel semiconductor region and the heavily-doped drain semiconductor region. DMOS transistors are commonly formed as lateral devices where the source and drain regions are horizontally spaced apart, and as vertical devices where the source and drain regions are vertically spaced apart.

In operation, vertical DMOS transistors typically provide better performance (e.g., a lower on-state drain-to-source resistance) than lateral DMOS transistors. Lateral DMOS transistors, however, are usually much easier to fabricate and, therefore, are less expensive to produce than vertical DMOS transistors.

FIG. 1 shows a cross-sectional diagram that illustrates a conventional vertical DMOS transistor 100 in accordance with the present invention. As shown in FIG. 1, vertical DMOS transistor 100 includes a semiconductor structure 110, such as a substrate or an epitaxial layer. Semiconductor structure 110, in turn, has an n+ drain region 112, an n− drain (drift) region 114 that touches and lies above n+ drain region 112, and a p− body region 116 that touches and lies above n− drift region 114.

Semiconductor structure 110 also includes an opening 122 that extends through p-body region 116 into n− drift region 114. Opening 122 has a bottom surface 124 and a side wall surface 125. In addition, semiconductor structure 110 includes n+ source regions 126A and 126B that touch p− body region 116. Depending on the vertical DMOS architecture that is utilized, the source regions 126A and 126B can be spaced apart or touch each other as a single region. As shown, n− drift region 114 and the n+ source regions 126A and 126B are vertically spaced apart and separated by channel regions 128A and 128B, respectively, of p− body region 116.

As further shown in FIG. 1, vertical DMOS transistor 100 also includes a gate oxide layer 136 that touches n− drift region 114 and p− body region 116 to line the bottom surface 124 and the side wall surface 125 of opening 122. In addition, vertical DMOS transistor 100 also includes a gate 142 that touches gate oxide layer 136. Gate 142, which is conductive, lies within opening 122 and fills the remainder of opening 122.

In operation, a first positive voltage is placed on n+ drain region 112 and a second positive voltage is placed on gate 142, while ground is placed on p− body region 116 and the n+ source regions 126A and 126B. In response to these bias conditions, the channel regions 128A and 128B of p− body region 116 invert, and electrons flow from the n+ source regions 126A and 126B to n+ drain region 112.

One important characteristic of a DMOS transistor is the breakdown voltage BVdss of the transistor, which is the drain-to-body voltage at which the junction breaks down and a current undesirably flows between the n-drift region and the p-body region. Since DMOS transistors are power transistors, there is a need to handle larger voltages and, thereby, a need to increase the breakdown voltage BVdss of the transistor.

Another important characteristic of a DMOS transistor is the on-state drain-to-source resistance $r_{DS(ON)}$. As just noted, DMOS transistors are power transistors and, as a result, can pass large currents when turned on. As a result, there is a need to reduce the on-state drain-to-source resistance $r_{DS(ON)}$ of the transistor.

BRIEF DESCRIPTION OF THE DRAWINGS

FIG. 2A is a cross-sectional, partial-perspective view of DMOS transistor 200, while FIG. 2B is a cross-sectional view of DMOS transistor 200 and FIG. 2C is a plan view of DMOS transistor 200 taken along lines 2C-2C of FIG. 2B.

FIG. 4A is a cross-sectional, partial-perspective view, while FIG. 4B is a cross-sectional view and FIG. 4C is a plan view taken along line 4C-4C of FIG. 4B.

FIG. 5A is a cross-sectional view. FIG. 5B is a plan view taken along line 5B-5B of FIG. 5A.

FIG. 6A is a cross-sectional view. FIG. 6B is a plan view taken along line 6B-6B of FIG. 6A.

DETAILED DESCRIPTION OF THE INVENTION

Figure 1:
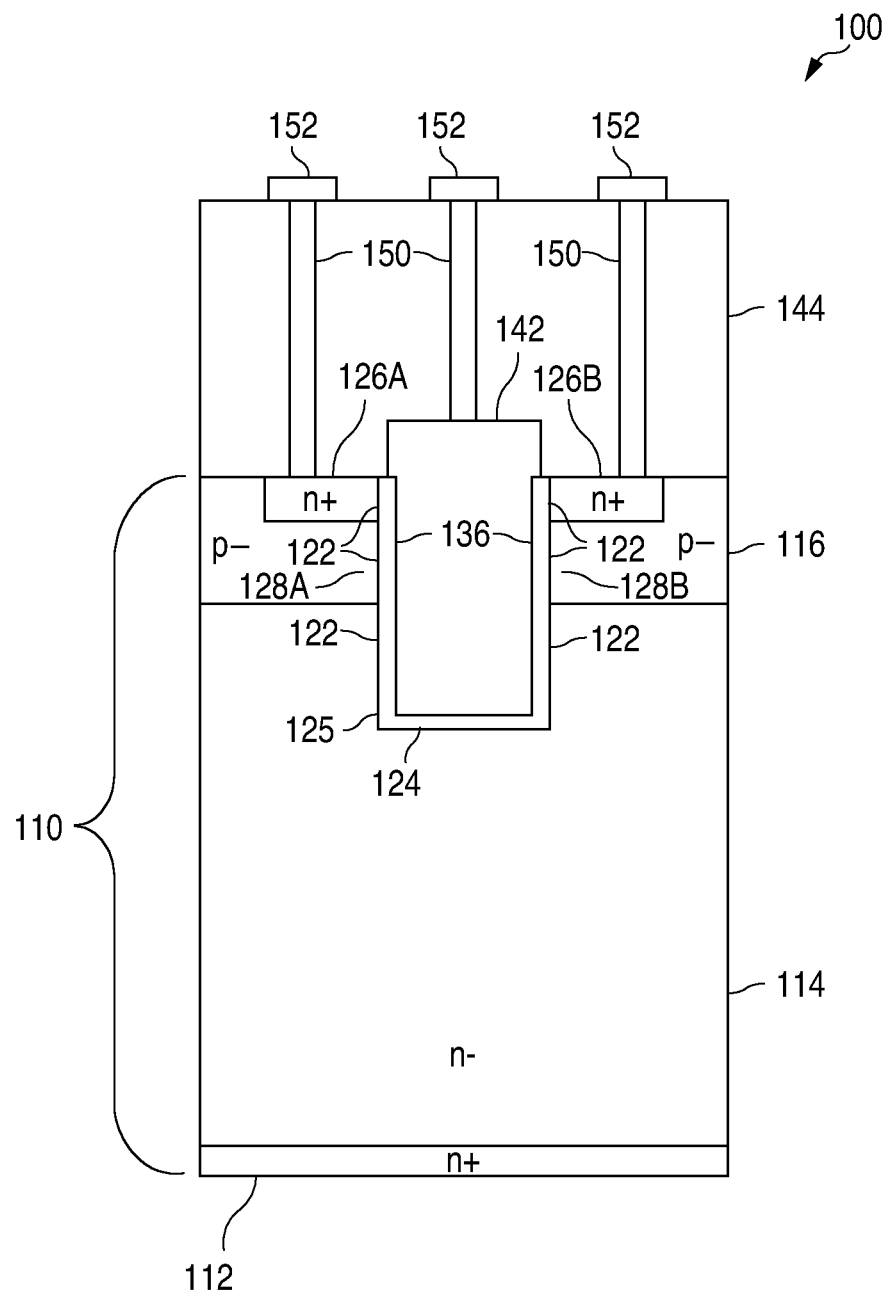
FIG. 1 is a cross-sectional diagram illustrating a conventional DMOS transistor 100.
Figure 2A:
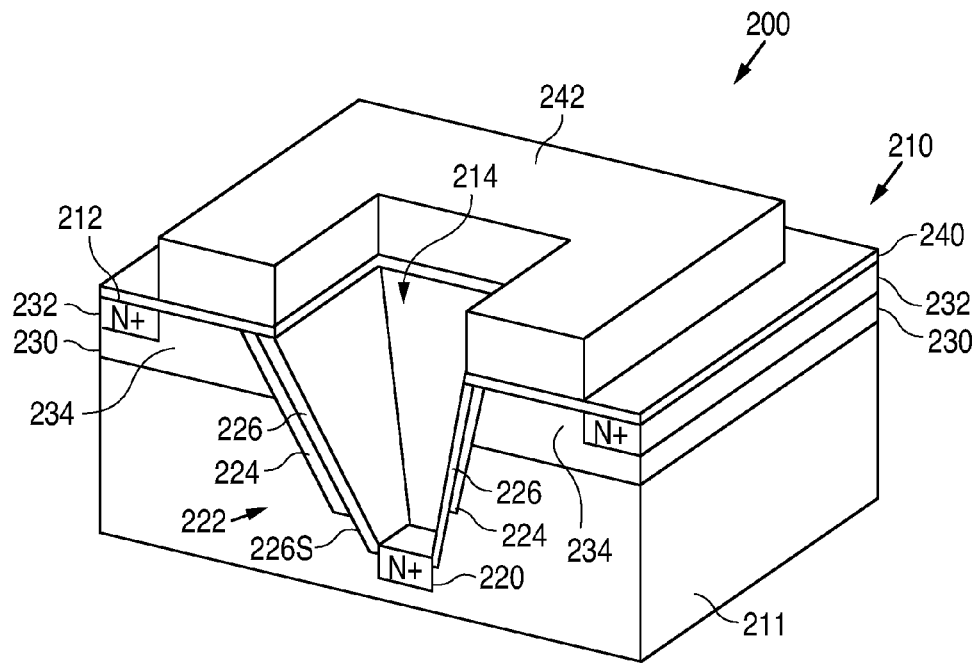
FIGS. 2A-2C are views illustrating a DMOS transistor 200 in accordance with the present invention.
Figure 2B:
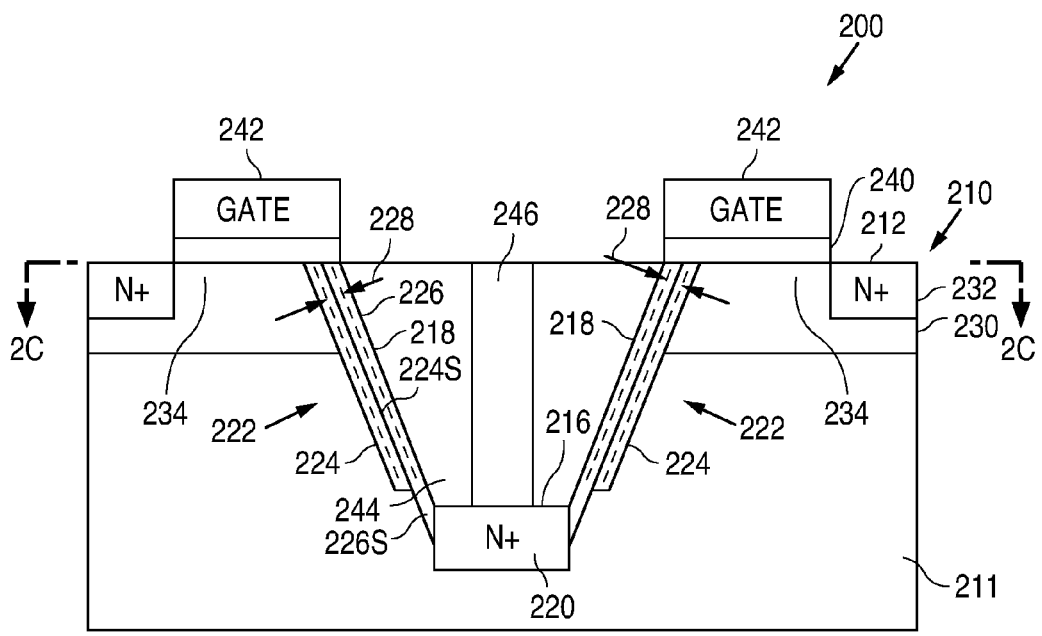
Figure 2C:
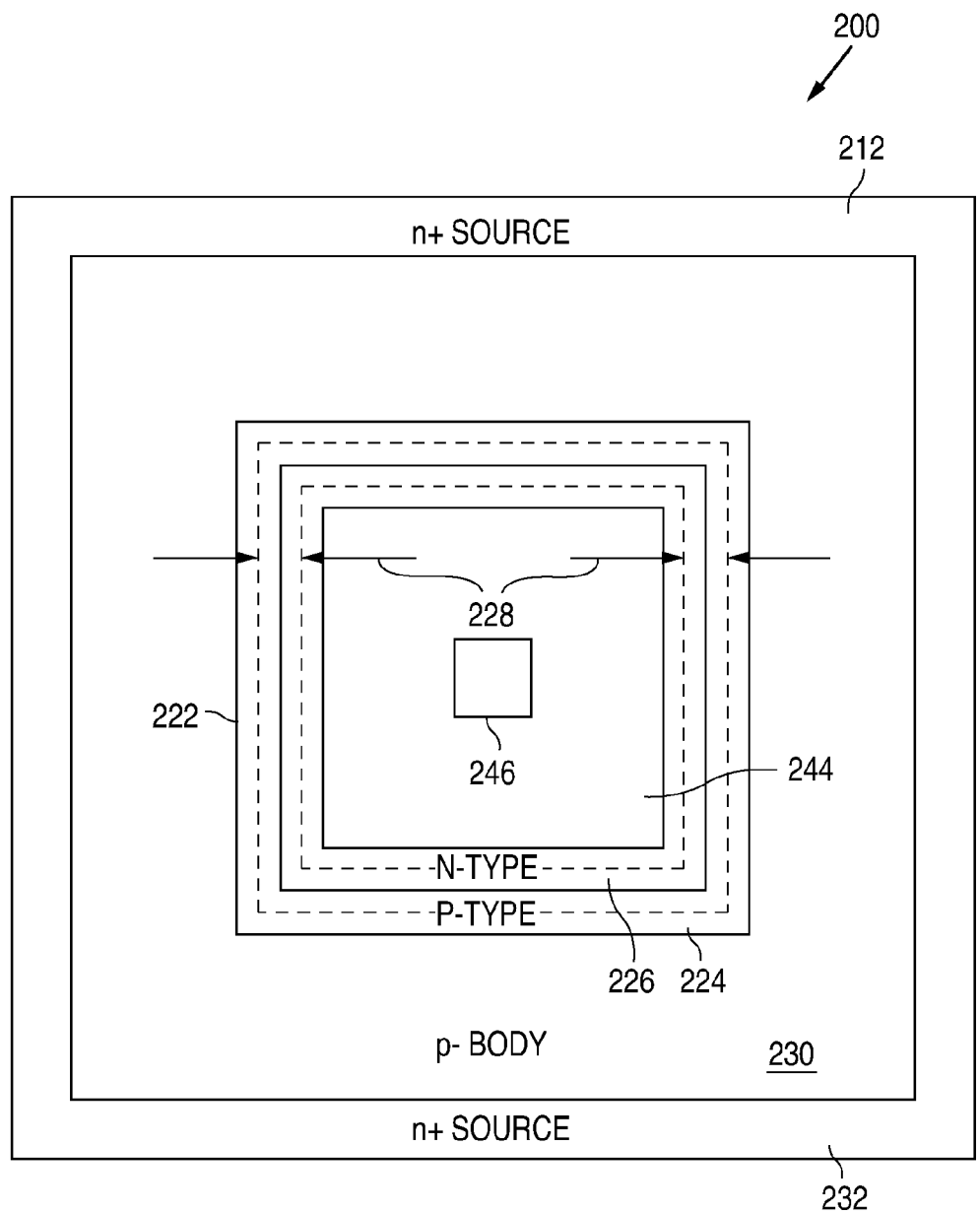

FIGS. 2A-2C show views that illustrate a DMOS transistor 200 in accordance with the present invention. FIG. 2A shows a cross-sectional, partial-perspective view of DMOS transistor 200, while FIG. 2B shows a cross-sectional view of DMOS transistor 200 and FIG. 2C shows a plan view of DMOS transistor 200 taken along lines 2C-2C of FIG. 2B. As described in greater detail below, DMOS transistor 200 increases the breakdown voltage BVdss and reduces the on-state drain-to-source resistance $r_{DS(ON)}$ by utilizing a slanted super junction drift structure.

As shown in FIGS. 2A-2C, DMOS transistor 200 has a semiconductor structure 210 that includes a semiconductor region 211, such as a substrate or an epitaxial layer. As further shown in FIGS. 2A-2C, semiconductor structure 210 has a top surface 212 and an opening 214 that extends from top surface 212 into semiconductor structure 210. Opening 214, in turn, has a bottom surface 216 and a slanted side wall surface 218.

Semiconductor structure 210 also has an n+ drain region 220 that touches the bottom surface 216 of opening 214, and a slanted super junction drift structure 222 that touches the side wall surface 218 of opening 214. Drift structure 222, in turn, includes a p-type layer 224 and an n-type layer 226 that touches and lies over p-type layer 224.

N-type layer 226 touches n+ drain region 220 and has a surface 226S that lies substantially in parallel with the slanted side wall surface 218 of opening 214. P-type layer 224 has a surface 224S that touches surface 226S of n-type layer 226, and therefore, also lies substantially in parallel with the side wall surface 218 of opening 214.

When n-type layer 226 touches p-type layer 224, a depletion region 228 is formed across the junction between the layers. Depletion region 228 has a depletion width (measured normal to the junction surface) that depends on the relative dopant concentrations of the layers. In the present example, the thicknesses and dopant concentrations of p-type layer 224 and n-type layer 226 are selected to maximize the width of depletion region 228.

Further, semiconductor structure 210 has a p-type body region 230 that touches p-type layer 224 of super junction drift region 222 and the top surface 212 of semiconductor structure 210, an n+ source region 232 that touches p-type body region 230, and a channel region 234 of the p-body region 230 that lies horizontally between and touches super junction drift structure 222 and n+ source region 232. Semiconductor structure 210 also has a p+ contact region (not shown) that touches p-type body region 230.

As further shown in FIGS. 2A-2C, DMOS transistor 200 also includes a non-conductive structure 240, such as a layer of gate oxide, that touches and lies above p-body region 230, and a gate 242 that touches non-conductive structure 240 and lies over the channel region 234 of p-body region 230. In addition, DMOS transistor 200 includes a non-conductive region 244, such as a region of oxide, which fills opening 214, and a metal drain contact 246 that extends through non-conductive region 244 to make an electrical connection with n+ drain region 220.

In operation, when a first positive voltage, such as 700V, is placed on n+ drain region 220, and ground is placed on p-body region 230 (by way of the p+ contact region) and n+ source region 232, DMOS transistor 200 turns off when ground is placed on gate 242. In this case, no electrons flow from n+ source region 232 to n+ drain region 220. One of the advantages of the present invention is that depletion layer 228 increases the breakdown voltage BVdss of DMOS transistor 200 which, in turn, allows DMOS transistor 200 to operate with higher drain voltage levels.

On the other hand, DMOS transistor 200 turns on when a second positive voltage, such as 12V, is placed on gate 242 while maintaining the remaining bias conditions. In this case, the channel region 234 of p-body region 230 inverts, and electrons flow from source region 232 through channel region 234 and slanted super junction drift structure 222 to drain region 220.

Another advantage of the present invention is that depletion layer 228 has a lower resistance than a conventional n− drift region. Thus, the present invention provides two significant advantages: a greater breakdown voltage BVdss when DMOS transistor 200 is turned off, and a lower on-state drain-to-source resistance $r_{DS(ON)}$ when DMOS transistor 200 is turned on.

Figure 3:
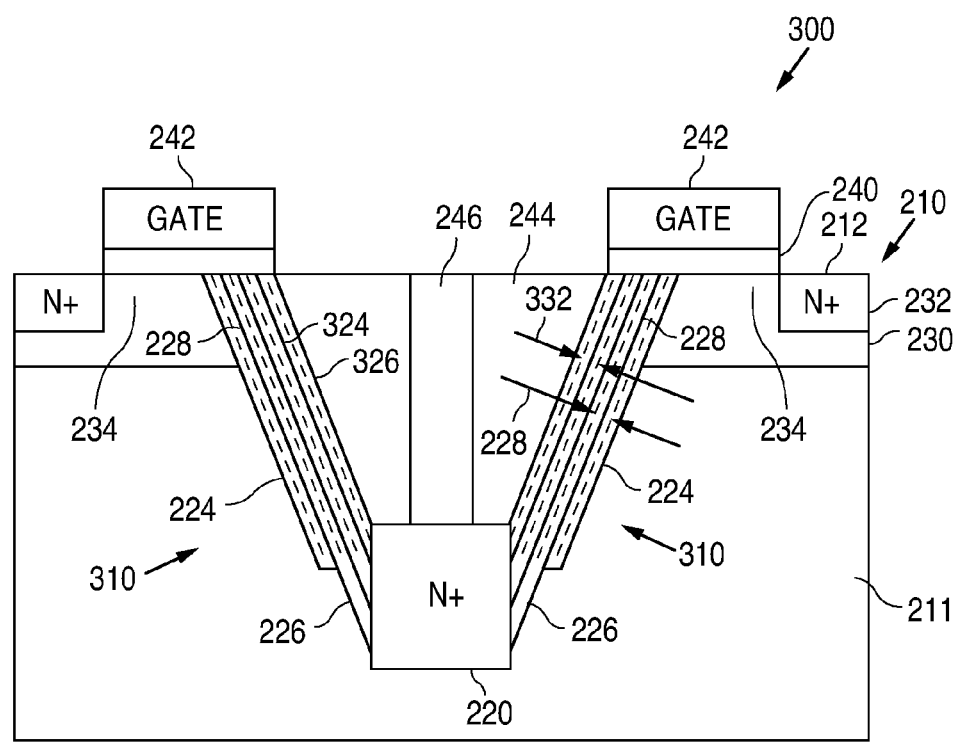
FIG. 3 is a cross-sectional view illustrating a DMOS transistor 300 in accordance with the present invention.

FIG. 3 shows a cross-sectional view that illustrates a DMOS transistor 300 in accordance with the present invention. DMOS transistor 300 is similar to DMOS transistor 200 and, as a result, utilizes the same reference numerals to designate the structures which are common to both transistors.

As shown in FIG. 3, DMOS transistor 300 differs from DMOS transistor 200 in that DMOS transistor 300 utilizes a slanted super junction drift structure 310 in lieu of slanted super junction drift structure 222. Slanted super junction drift structure 310, in turn, is the same as slanted super junction drift structure 222, except that slanted super junction drift structure 310 also includes a p-type layer 324 that touches and lies over n-type layer 226, and an n-type layer 326 that touches and lies over p-type layer 324.

As noted above, when n-type layer 226 touches p-type layer 224, depletion region 228 is formed across the junction between the layers with a width that depends on the relative dopant concentrations of the layers. Similarly, when n-type layer 326 touches p-type layer 324, a depletion region 332 is formed across the junction between the layers with a width that depends on the relative dopant concentrations of the layers. In the present example, the thicknesses and dopant concentrations of p-type layer 224, n-type layer 226, p-type layer 324, and n-type layer 326 are selected to maximize the widths of depletion region 228 and depletion region 332.

DMOS transistor 300 operates the same as DMOS transistor 200. One of the advantages of DMOS transistor 300 is that the depletion layers 228 and 332 of DMOS transistor 300 further increase the breakdown voltage of the transistor, and further reduce the on-state drain-to-source resistance $r_{DS(ON)}$ of the transistor.

Figure 4A:
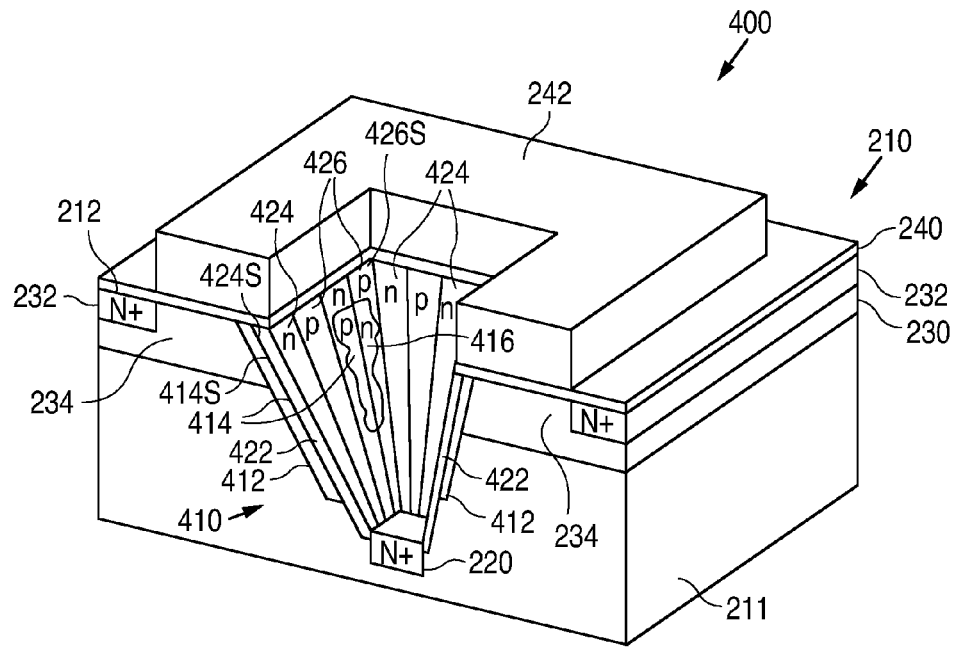
FIGS. 4A-4C are views illustrating a DMOS transistor 400 in accordance with the present invention.
Figure 4B:
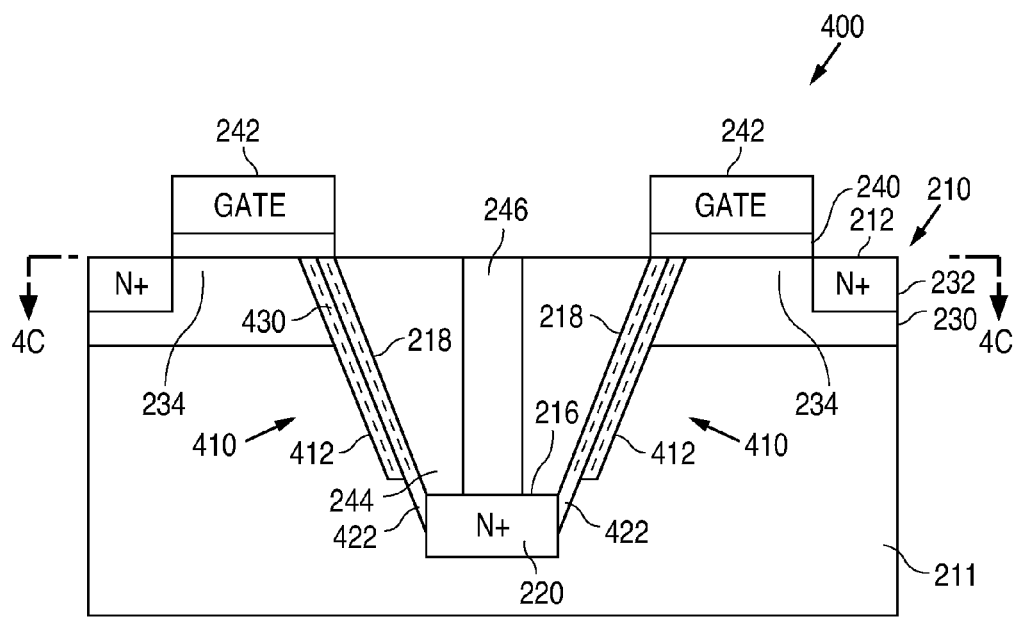
Figure 4C:
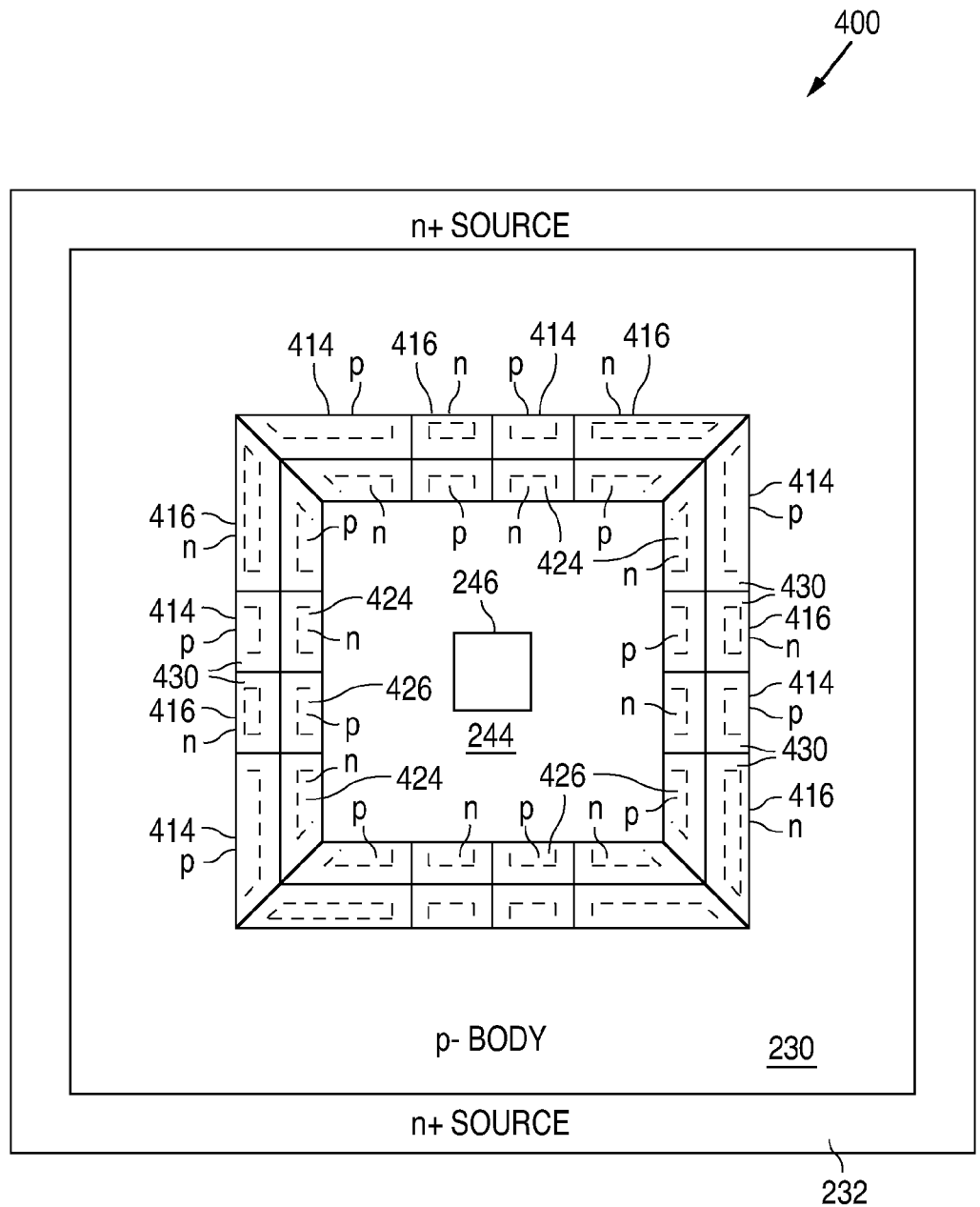

FIGS. 4A-4C show views that illustrate a DMOS transistor 400 in accordance with the present invention. FIG. 4A shows a cross-sectional, partial-perspective view, while FIG. 4B shows a cross-sectional view and FIG. 4C shows a plan view taken along line 4C-4C of FIG. 4B. DMOS transistor 400 is similar to DMOS transistor 200 and, as a result, utilizes the same reference numerals to designate the structures which are common to both transistors.

As shown in FIGS. 4A-4C, transistor 400 differs from transistor 200 in that transistor 400 utilizes a slanted super junction drift region 410 in lieu of slanted super junction drift region 222. Slanted super junction drift region 410, in turn, differs from slanted super junction drift region 222 in that drift region 410 utilizes a lower layer 412 of alternating p-type strips 414 and n-type strips 416 in lieu of p-type layer 224.

In addition, super junction drift region 410 utilizes an upper layer 422 of alternating n-type strips 424 and p-type strips 426 in lieu of n-type layer 226. Further, the lower and upper layers 412 and 422 are aligned so that the n-type strips 424 touch and overlie the p-type strips 414, and the p-type strips 426 touch and overlie the n-type strips 416.

Each p-type strip 414 has a surface 414S, each n-type strip 424 has a surface 424S, and each p-type strip 426 has a surface 426S that lies substantially in parallel with the side wall surface 218 of opening 214. Further, surface 414S of p-type strip 414 touches surface 424S of n-type strip 424.

When each n-type strip 416 and 424 touches an adjoining p-type strip 414 and 426, a depletion region 430 is formed across the junction between the regions with a width that depends on the relative dopant concentrations of the strips. In the present example, the thicknesses and dopant concentrations of the n-type strips 416 and 424 and the p-type strips 414 and 426 are selected to maximize the width of depletion region 430. Further, DMOS transistor 400 operates the same as DMOS transistor 200, except that depletion region 430 provides a different breakdown voltage and a different on-state drain-to-source resistance $r_{DS(ON)}$.

Figure 5A:
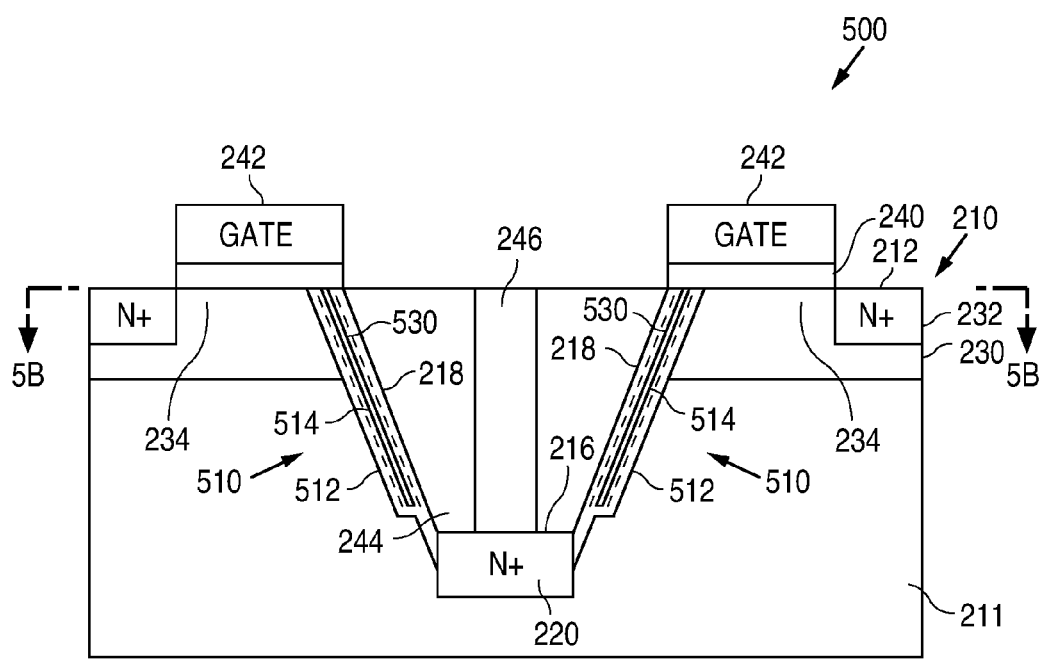
FIGS. 5A and 5B are views illustrating a DMOS transistor 500 in accordance with the present invention.
Figure 5B:
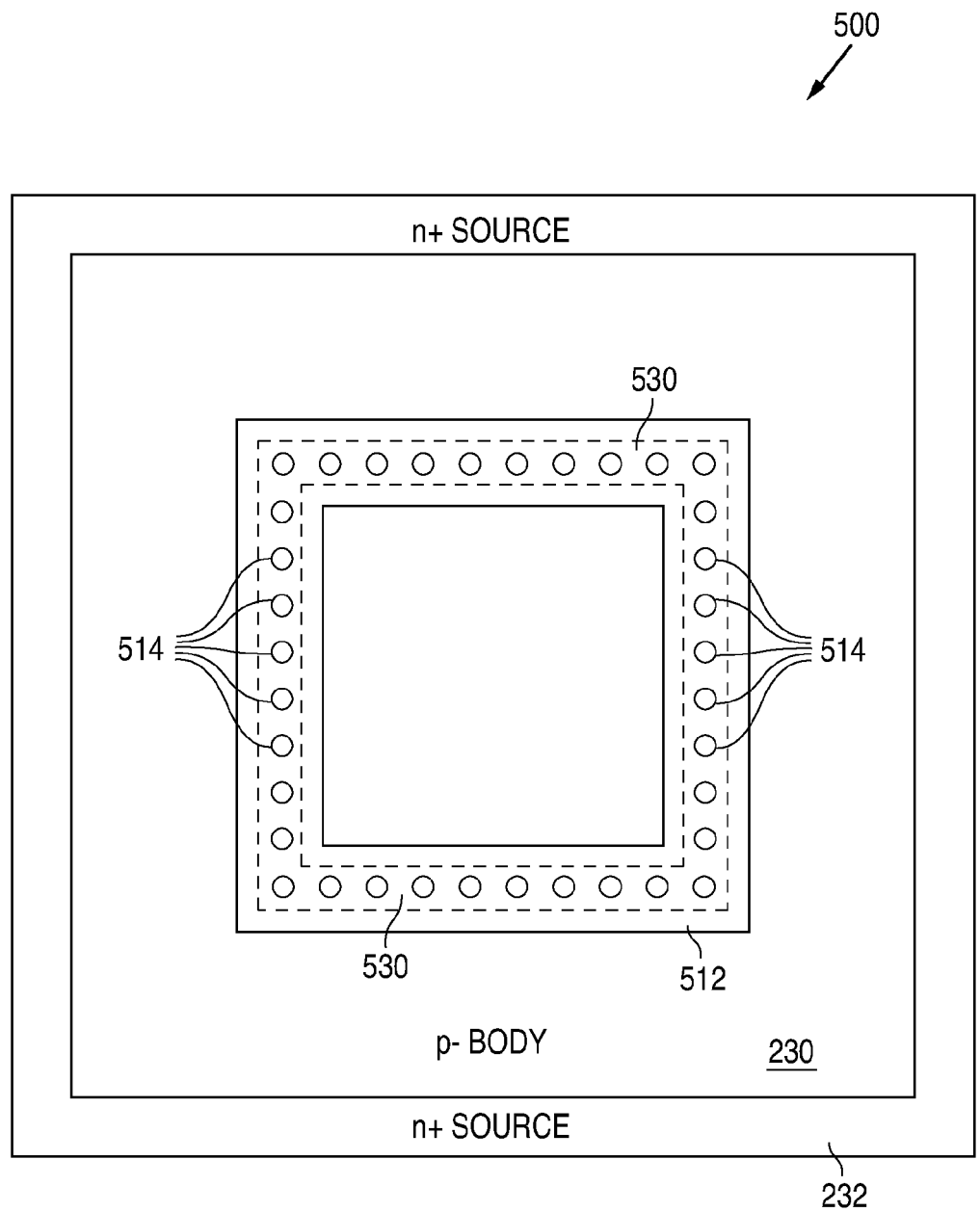

FIGS. 5A and 5B show views that illustrate a DMOS transistor 500 in accordance with the present invention. FIG. 5A shows a cross-sectional view, while FIG. 5B shows a plan view taken along line 5B-5B of FIG. 5A. DMOS transistor 500 is similar to DMOS transistor 200 and, as a result, utilizes the same reference numerals to designate the structures which are common to both transistors.

As shown in FIGS. 5A and 5B, transistor 500 differs from transistor 200 in that transistor 500 utilizes a slanted super junction drift region 510 in lieu of slanted super junction drift region 222. Slanted super junction drift region 510, in turn, includes an n-type region 512 and a number of rod-shaped p-type regions 514 that are formed in n-type region 512.

When n-type region 512 touches a rod-shaped p-type region 514, a depletion region 530 is formed across the junction between the regions. In the present example, the thickness of n-type region 512 and the size, placement, and dopant concentrations of the rod-shaped p-type regions 514 are selected to maximize the width of depletion region 530. DMOS transistor 500 operates the same as DMOS transistor 200, except that depletion region 530 provides a different breakdown voltage and a different on-state drain-to-source resistance $r_{DS(ON)}$.

Further, in an alternate embodiment, n-type region 512 can also be thicker so that multiple levels of rod-shaped p-type regions 514 can be used, e.g., additional rod-shaped p-type regions 514 can be used so that each rod-shaped p-type region 514 has a spaced-apart, overlying rod-shaped p-type region 514, thereby enlarging depletion region 530.

Figure 6A:
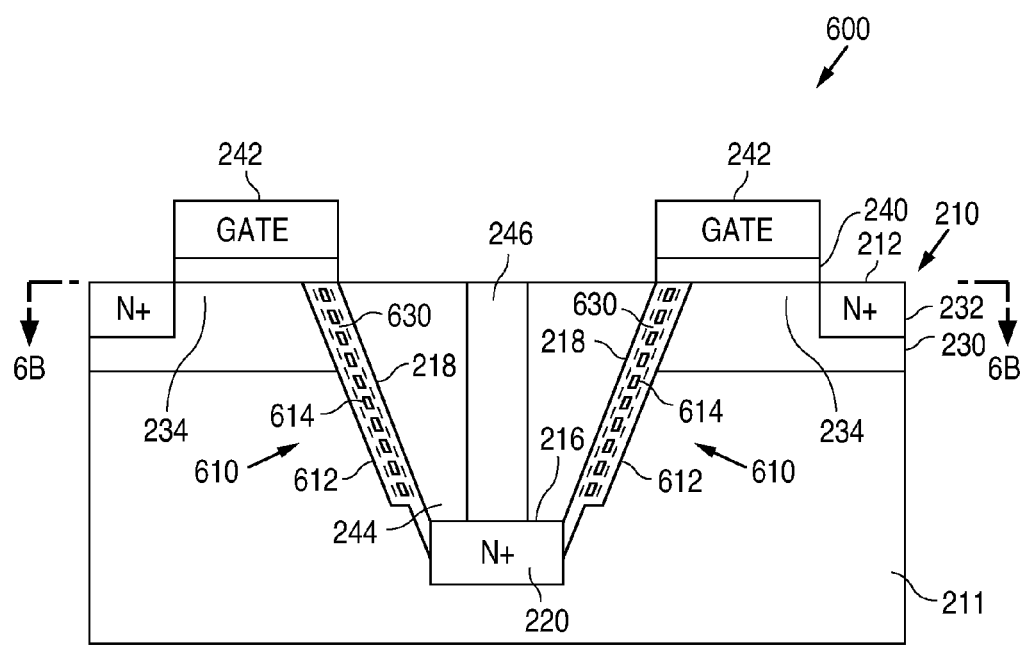
FIGS. 6A and 6B are views illustrating a DMOS transistor 600 in accordance with the present invention.
Figure 6B:
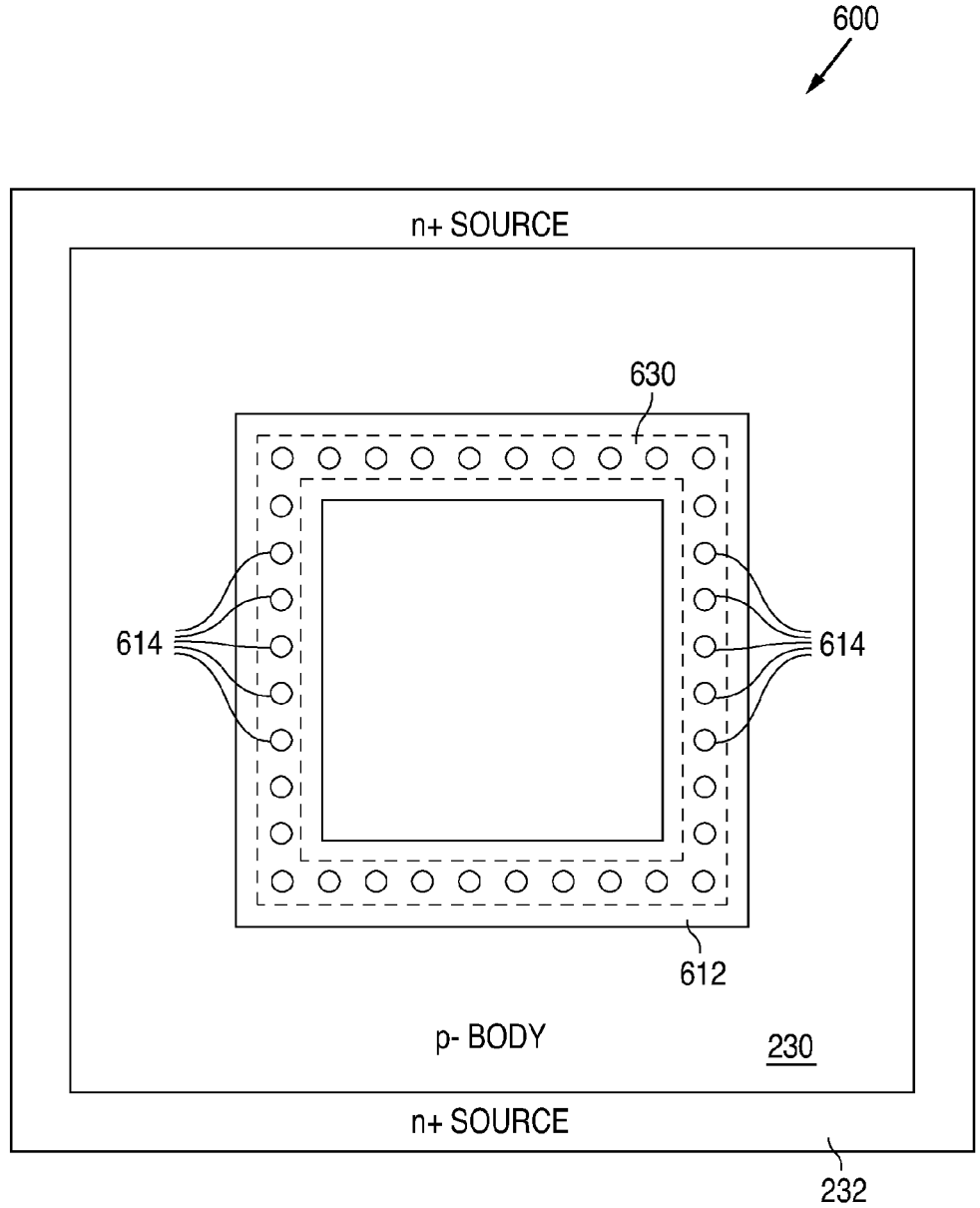

FIGS. 6A and 6B show views that illustrate a DMOS transistor 600 in accordance with the present invention. FIG. 6A shows a cross-sectional view, while FIG. 6B shows a plan view taken along line 6B-6B of FIG. 6A. DMOS transistor 600 is similar to DMOS transistor 200 and, as a result, utilizes the same reference numerals to designate the structures which are common to both transistors.

As shown in FIGS. 6A-6B, DMOS transistor 600 differs from DMOS transistor 200 in that DMOS transistor 600 utilizes a slanted super junction drift region 610 in lieu of slanted super junction drift region 222. Slanted super junction drift region 610, in turn, includes an n-type region 612 and a number of p-type spherical regions 614 that are formed in n-type region 612.

When n-type region 612 touches a p-type spherical region 614, a depletion region 630 is formed across the junction between the regions. In the present example, the thickness of n-type region 612 and the size, placement, and dopant concentrations of the p-type spherical regions 614 are selected to maximize the width of depletion region 630. DMOS transistor 600 operates the same as DMOS transistor 200, except that depletion region 630 provides a different breakdown voltage and a different on-state drain-to-source resistance $r_{DS(ON)}$.

Further, in an alternate embodiment, n-type region 612 can also be thicker so that multiple levels of p-type spherical regions 514 can be used, e.g., additional p-type spherical regions 614 can be used so that each p-type spherical region 614 has a spaced-apart, overlying p-type spherical region 614, thereby enlarging depletion region 630.

Figure 7:
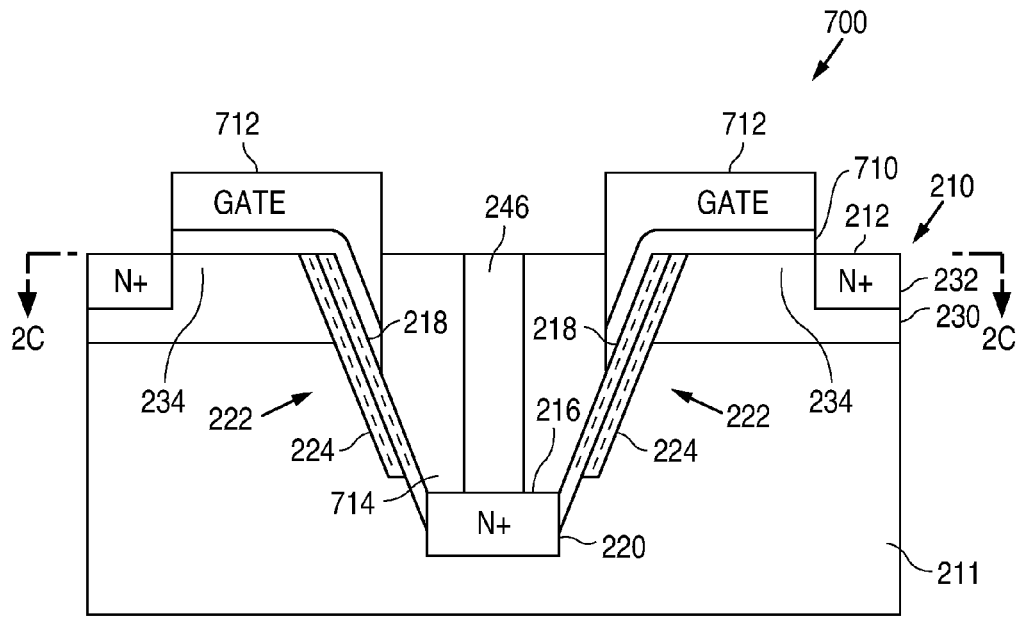
FIG. 7 is a cross-sectional view illustrating a DMOS transistor 700 in accordance with the present invention.

FIG. 7 shows a cross-sectional view that illustrates a DMOS transistor 700 in accordance with the present invention. DMOS transistor 700 is similar to DMOS transistor 200 and, as a result, utilizes the same reference numerals to designate the structures which are common to both transistors.

As shown in FIG. 7, DMOS transistor 700 differs from DMOS transistor 200 in that DMOS transistor 700 utilizes a non-conductive layer 710 and a gate 712 in lieu of non-conductive layer 240 and gate 242, respectively. Layer 710 and gate 712, in turn, are the same as layer 240 and gate 242, except that layer 710 and gate 712 extend part way into opening 214.

In addition, a non-conductive region 714 touches n+ drain region 220 to fill up the remainder of opening 214. Transistor 700 operates the same as transistor 200, except that gate 712 attracts electrons to the region of the top edge of opening 214. The increased electrons reduce the effect of the corner where the current transitions from a lateral to a downward angled flow. The gate structure of transistor 700 can also be used with DMOS transistors 300, 400, 500, 600, and 800.

Figure 8:
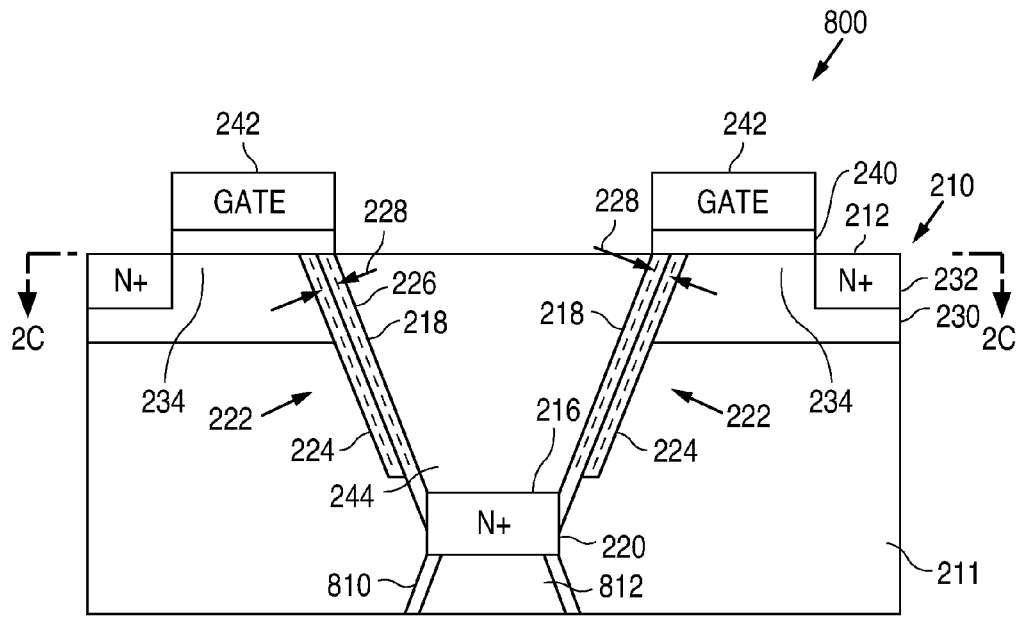
FIG. 8 is a cross-sectional view illustrating a DMOS transistor 800 in accordance with the present invention.

FIG. 8 shows a cross-sectional view that illustrates a DMOS transistor 800 in accordance with the present invention. DMOS transistor 800 is similar to DMOS transistor 200 and, as a result, utilizes the same reference numerals to designate the structures which are common to both transistors.

As shown in FIG. 8, DMOS transistor 800 differs from DMOS transistor 200 in that DMOS transistor 800 utilizes, in lieu of contact 246, a non-conductive structure 810 that touches semiconductor region 211, and a metal back side contact 812 that touches non-conductive structure 810 and extends into semiconductor region 211 to make an electrical connection with n+ drain region 220. Thus, FIG. 8 illustrates DMOS transistor 200 with a back side drain connection. The back side electrical connection of transistor 800 can also be used with DMOS transistors 300, 400, 500, 600, and 700.

Figure 9A:
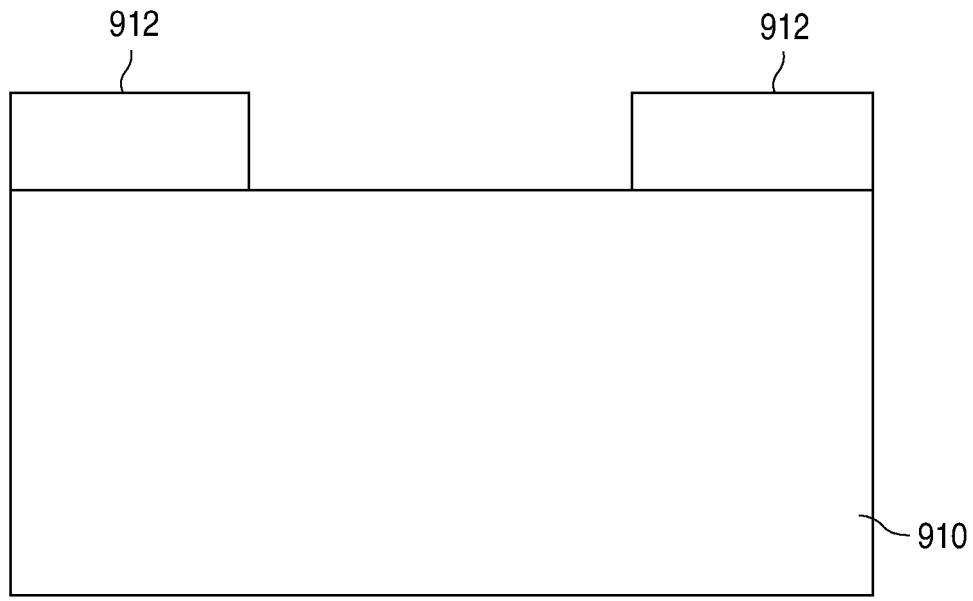
FIGS. 9A-9L are cross-sectional views illustrating an example of a method of forming DMOS transistor 200 in accordance with the present invention.

FIGS. 9A-9L show cross-sectional views that illustrate an example of a method of forming DMOS transistor 200 in accordance with the present invention. As shown in FIG. 9A, the method, which utilizes a conventionally-formed n-type semiconductor structure 910, such as a substrate or an epitaxial layer, begins by forming a hard mark 912 on the top surface of semiconductor structure 910.

Hard mask 912 can be formed in a conventional manner. For example, in one common approach, a layer of silicon nitride is deposited onto semiconductor structure 910 by low-pressure chemical vapor deposition (LPCVD). Following this, a patterned photoresist layer is formed on the top surface of the layer of silicon nitride.

The patterned photoresist layer is also formed in a conventional manner, which includes depositing a layer of photoresist, and projecting a light through a patterned black/clear glass plate known as a mask to form a patterned image on the layer of photoresist. The light softens the photoresist regions exposed to the light. Following this, the softened photoresist regions are removed.

After the patterned photoresist layer has been formed, the exposed regions of the silicon nitride layer are etched in a conventional manner to expose regions on the surface of semiconductor structure 910, and thereby form hard mask 912. Thus, hard mask 912 has a pattern that is defined by the etch of the silicon nitride layer. After the etch of the silicon nitride layer, the patterned photoresist layer is removed.

Figure 9B:
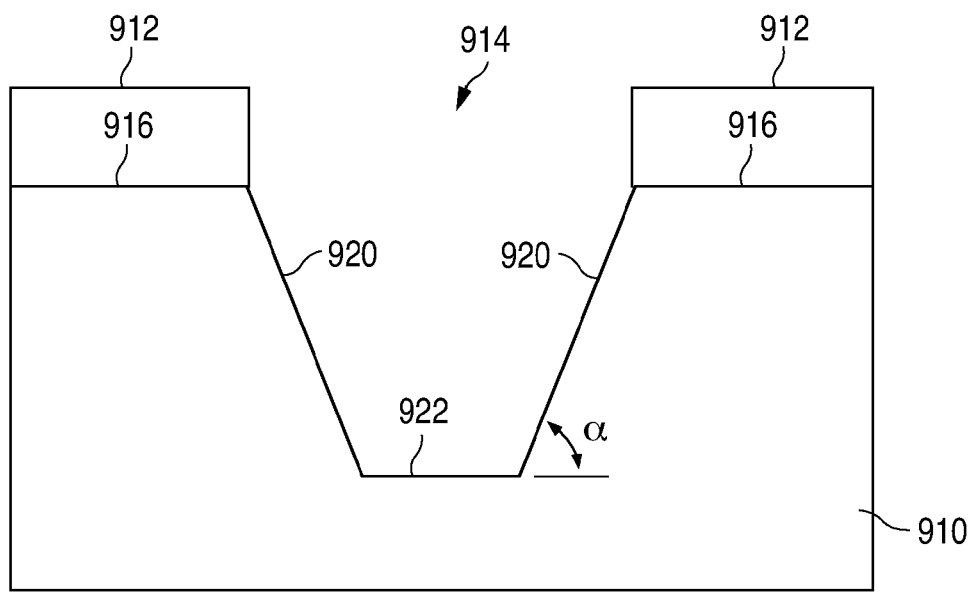

As shown in FIG. 9B, after hard mask 912 has been formed, the exposed regions of structure 910 are anisotropically wet etched in a conventional manner to form a number of drain openings 914 in structure 910. (Only one drain opening 914 is shown for clarity.) Each drain opening 914 extends into structure 910 from a substantially planar top surface 916 of structure 910.

Structure 910 is wet etched with an etchant, such as Tetra Methyl Ammonium Hydroxide (TMAH), Potassium Hydroxide (KOH), or KOH/Ethanol, that provides significantly different etch rates along the crystal planes. (KOH and KOH/ethanol may not be favored because of potential potassium contamination of the equipment.)

As further shown in FIG. 9B, the etch of structure 910 forms each of the drain openings 914 to have an inverted pyramid shape with a flat bottom surface 918 and slanted sidewall surface 920. For example, an anisotropic wet etch of a <100> silicon wafer etches along the crystallographic planes to form drain opening 914 with a flat-bottomed inverted pyramid shape that has a side wall angle $\alpha$ equal to 54.7°. Following the etch, hard mask 912 is removed in a conventional manner.

Figure 9C:
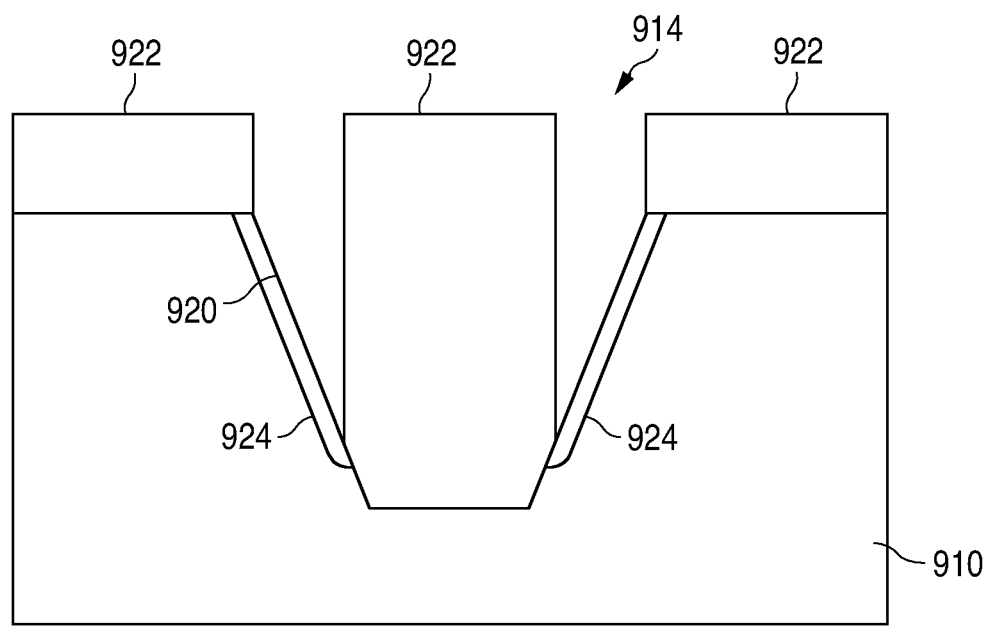

As shown in FIG. 9C, following the removal of hard mask 912, a patterned photoresist layer 922 is formed on structure 910 in a conventional manner. After this, a p-type dopant, such as boron, is implanted into the side wall surface 920 of drain opening 914 to form a p-type layer 924. The implant can be vertical, angled, or as shown in FIG. 9C, a combination of both vertical and angled implants. Following this, patterned photoresist layer 922 is removed in a conventional manner.

Figure 9D:
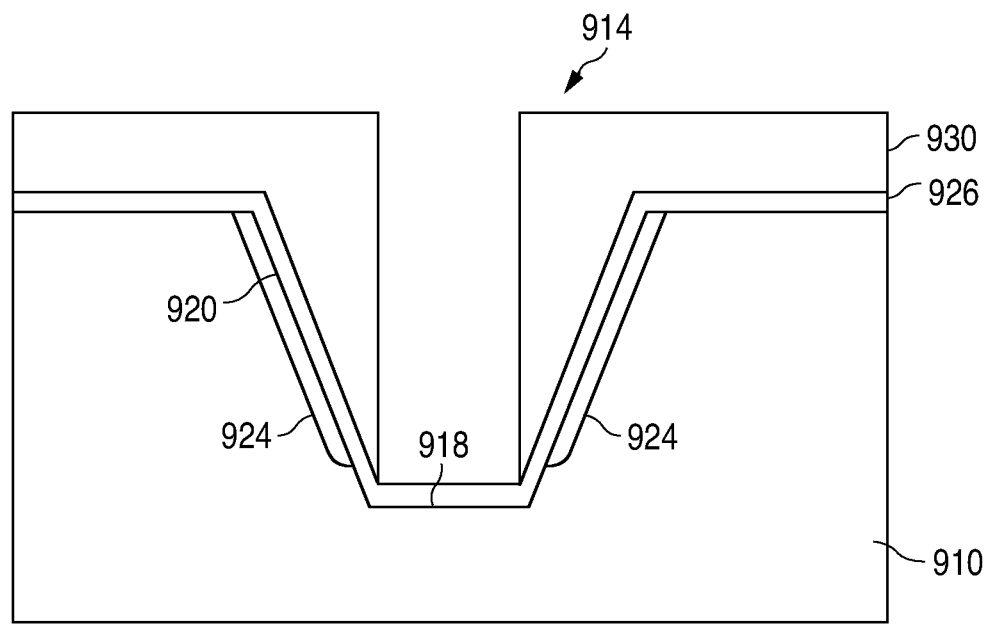

Once patterned photoresist layer 922 has been removed, as shown in FIG. 9D, an n-type epitaxial layer 926 is grown on structure 910 to line drain opening 914. Following this, a patterned photoresist layer 930 is formed on n-type epitaxial layer 926 in a conventional manner to expose the portion of n-type epitaxial layer 926 that lies over the bottom surface 918 of drain opening 914.

Figure 9E:
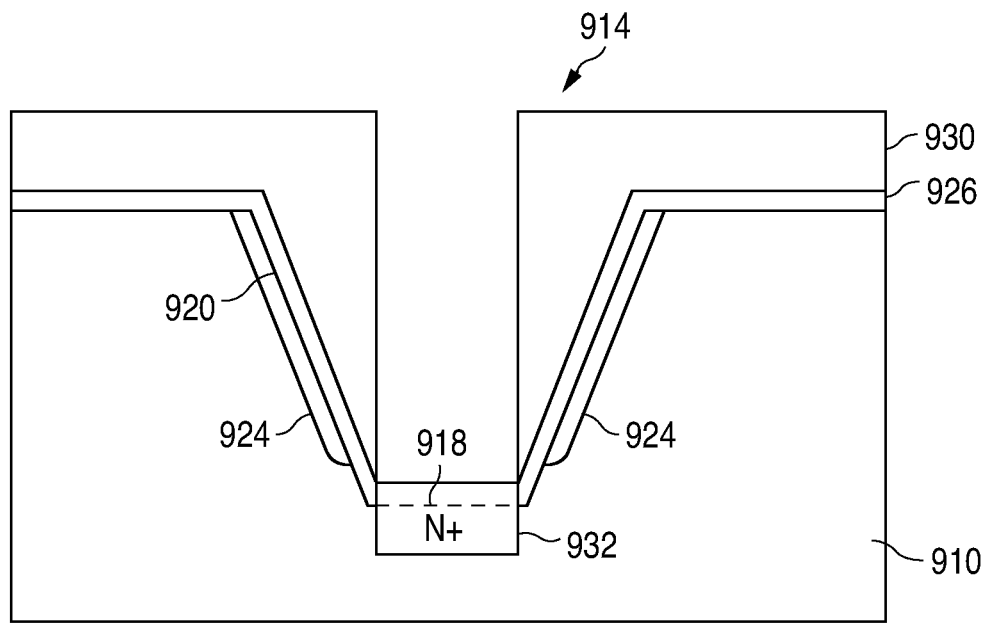

Next, as shown in FIG. 9E, an n-type dopant, such as phosphorous, is implanted into n-type epitaxial layer 926 and semiconductor structure 910 to form an n+ drain region 932 that touches the bottom surface 918 of drain opening 914. For example, the implant can be formed with a dose of $5 \times 10^{15}$ atoms/cm$^3$ and an implant energy of 80 KeV. Following this, patterned photoresist layer 930 is removed in a conventional manner.

Figure 9F:
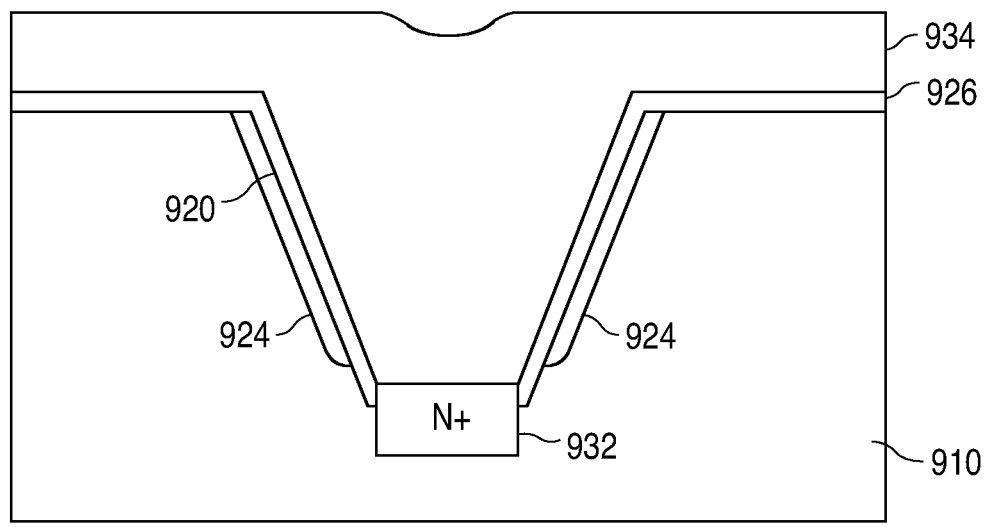
Figure 9G:
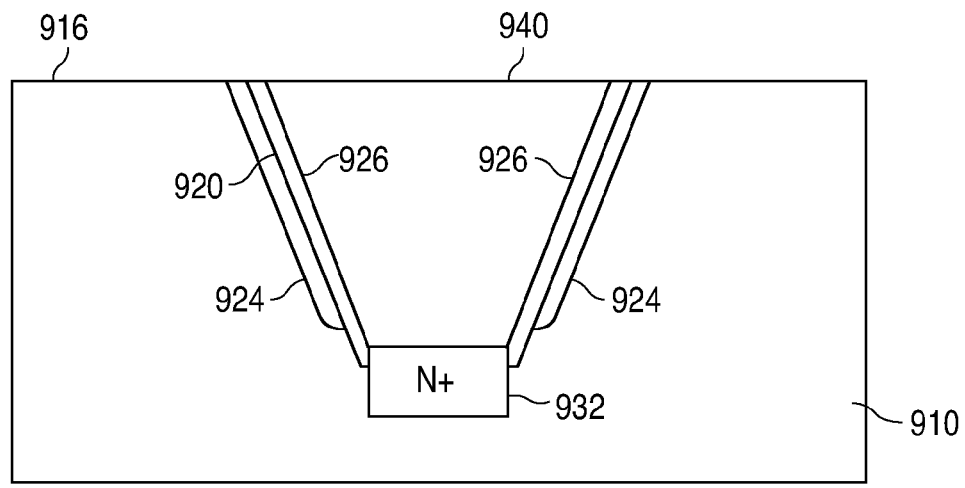

As shown in FIG. 9F, once patterned photoresist layer 930 has been removed, a non-conductive layer 934, such as oxide, is formed on n-type epitaxial layer 926 to fill up drain opening 914. Following the formation of non-conductive layer 934, as shown in FIG. 9G, non-conductive layer 934 and epitaxial layer 926 are planarized to remove the portions of non-conductive layer 934 and epitaxial layer 926 that lie over the top surface 916 of structure 910. As further shown in FIG. 9G, the planarization forms a non-conductive region 940 that lies in drain opening 914. Non-conductive layer 934 and epitaxial layer 926 can be planarized in a conventional manner, such as with chemical-mechanical polishing.

Figure 9H:
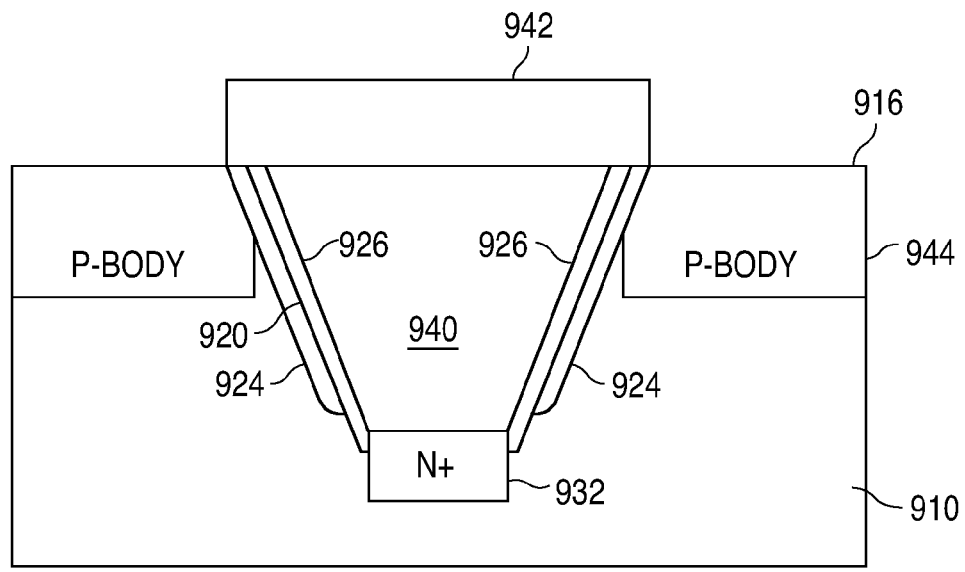

Next, as shown in FIG. 9H, a patterned photoresist layer 942 is formed on structure 910 in a conventional manner to expose a portion of the top surface 916 of structure 910. After this, a p-type dopant, such as boron, is implanted into the top surface 916 of structure 910. For example, an implant can be made with a dose of $2.2 \times 10^{13}$ atoms/cm$^3$ and an implant energy of 50 KeV. Following this, patterned photoresist layer 942 is removed in a conventional manner. The dopant is then driven in and activated in a conventional manner to form a lightly-doped p-body region 944. (The drive in also drives in and activates p-type layer 924, n-type layer 926, and n+ drain region 932, which each can also be driven in and activated after each implanted region is formed.)

Figure 9I:
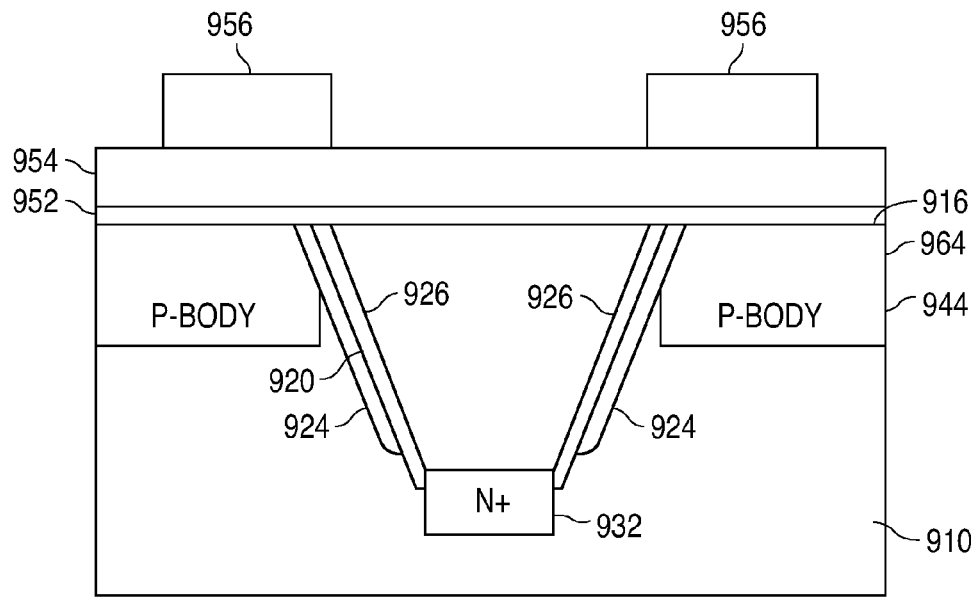

As shown in FIG. 9I, after patterned photoresist layer 942 has been removed, a non-conductive layer 952, such as a gate oxide, is formed on the top surface 916 of structure 910. Following the formation of non-conductive layer 952, a polysilicon layer 954 is formed to touch gate oxide layer 952.

Once polysilicon layer 954 has been formed, polysilicon layer 954 is doped using, for example, an n-type blanket implant with a dose of $1.79 \times 10^{16}$ atoms/cm$^3$ and an implant energy of 30 KeV. After this, a patterned photoresist layer 956 is formed on polysilicon layer 954 in a conventional manner.

Figure 9J:
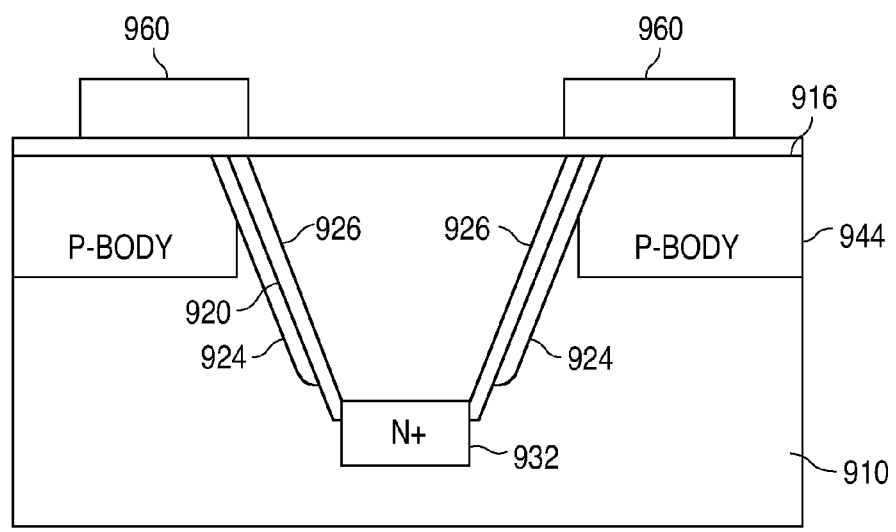
Figure 9K:
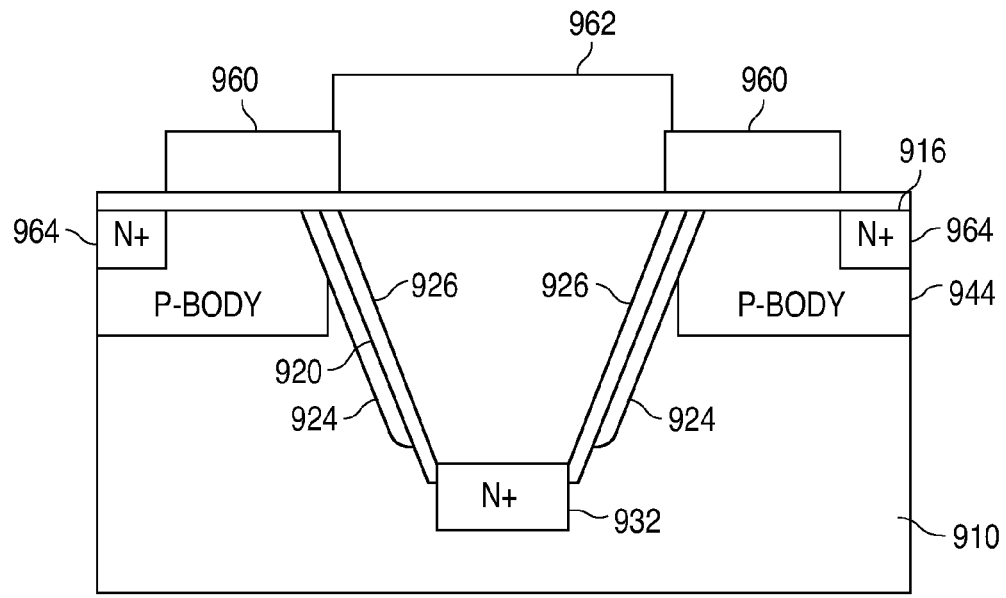

Following this, as shown in FIG. 9J, the exposed regions of polysilicon layer 954 are removed to form a gate 960. Patterned photoresist layer 956 is then removed. After this, as shown in FIG. 9K, a patterned photoresist layer 962 is formed over structure 910 in a conventional manner.

Next, an n-type dopant, such as arsenic, is implanted into the top surface 916 of structure 910 to form an n+ source region 964 in p-body region 944. For example, the implant can be formed with a dose of $5 \times 10^{15}$ atoms/cm$^3$ and an implant energy of 80 KeV. Depending on the DMOS architecture employed, n+ source region 964 can be formed as a single n+ region (e.g., that laterally surrounds opening 914), or as spaced apart n+ source regions (e.g., on opposite sides of a trench).

Figure 9L:
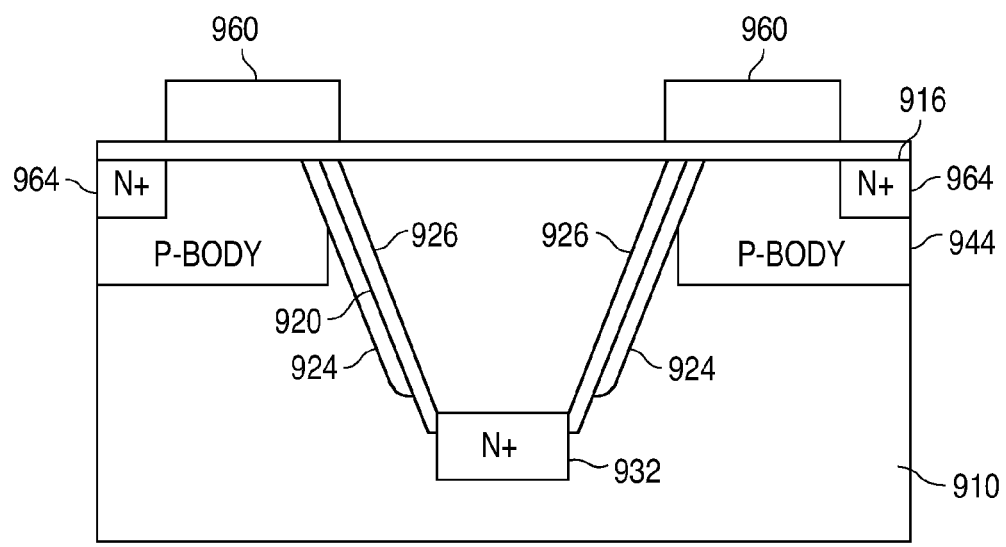

Following this, as shown in FIG. 9L, patterned photoresist layer 962 is removed in a conventional manner. (A p+ contact region is formed in the same manner as n+ source region 964, i.e., by forming a patterned photoresist layer, implanting a p-type dopant into the top surface 916 of structure 910 to form a p+ contact region 964 in p-body region 944, and removing the patterned photoresist layer.)

Following the implants, a conventional rapid thermal process is used to drive in and activate n+ source region 964 (which further drives in and activates the other implanted regions). Once n+ source region 964 has been activated, the method continues with conventional back end processing steps to complete the formation of DMOS transistor 200.

Figure 10:
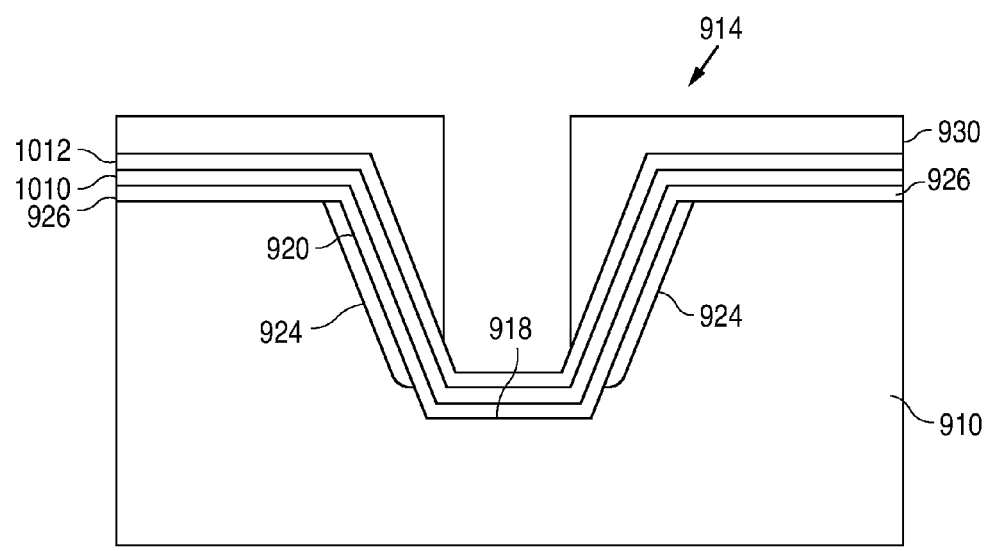
FIG. 10 is a cross-sectional view illustrating an example of a method of forming DMOS transistor 300 in accordance with the present invention.

FIG. 10 shows a cross-sectional view that illustrates an example of a method of forming DMOS transistor 300 in accordance with the present invention. DMOS transistor 300 is formed in the same manner that DMOS transistor 200 is formed, except that after n-type epitaxial layer 926 has been grown on structure 910 to line drain opening 914 as shown in FIG. 9D, a p-type epitaxial layer 1010 is grown on n-type epitaxial layer 926, and an n-type epitaxial layer 1012 is grown on p-type epitaxial layer 1010.

As a result, patterned photoresist layer 930 is formed on n-type epitaxial layer 1012 rather than n-type epitaxial layer 926 in a conventional manner to expose the portions of layers 924, 926, 1010, and 1012 that lie over the bottom surface 918 of drain opening 914. In addition, the epitaxial formation of p-type layer 1010 illustrates that p-type layer 924 can alternately be formed by epitaxial growth instead of as an implanted region.

Figure 11A:
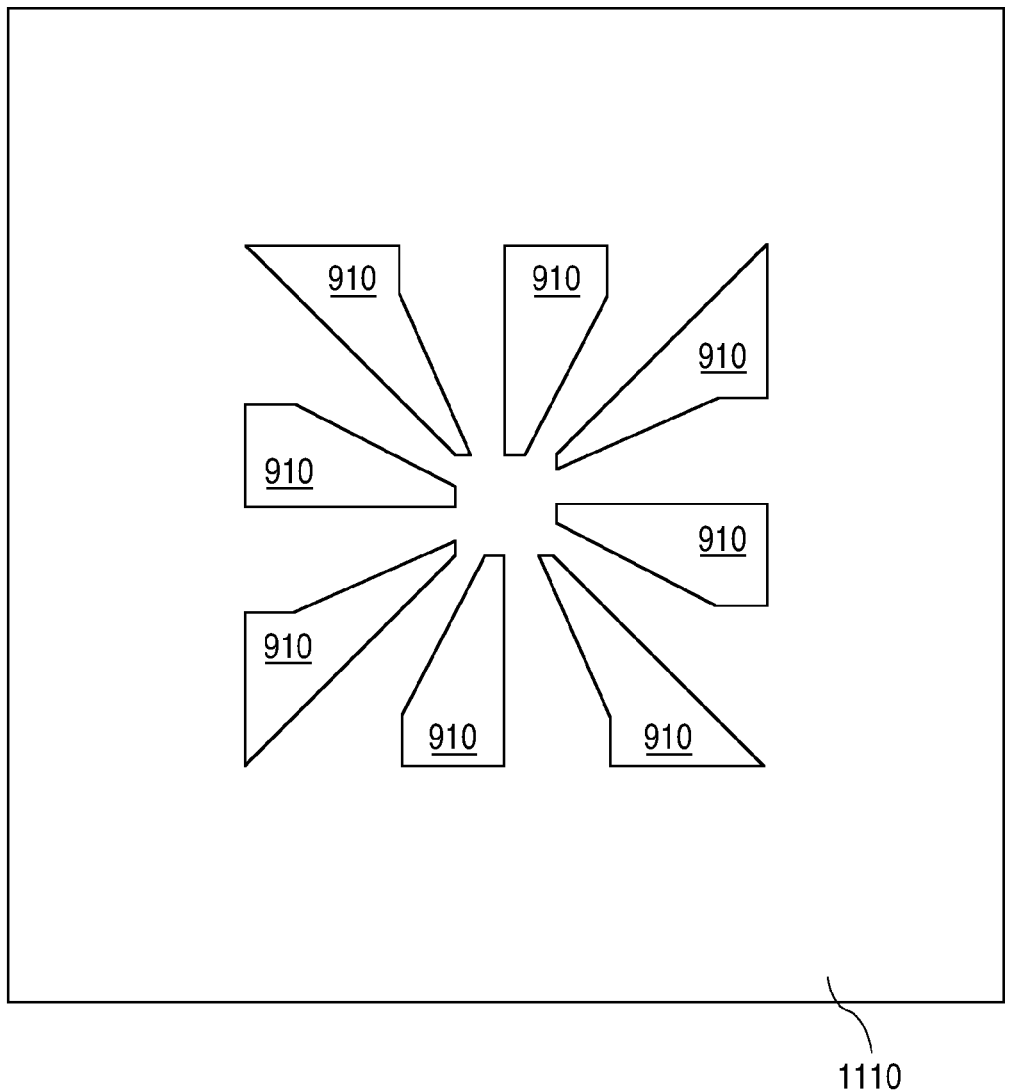
FIGS. 11A-11E are a series of plan views illustrating an example of a method of forming DMOS transistor 400 in accordance with the present invention.

FIGS. 11A-11E show a series of plan views that illustrate an example of a method of forming DMOS transistor 400 in accordance with the present invention. DMOS transistor 400 is formed in the same manner that DMOS transistor 200 is formed except that, as shown in FIG. 11A, a patterned photoresist layer 1110 is formed on structure 910 in lieu of forming patterned photoresist layer 922 shown in FIG. 9C.

Figure 11B:
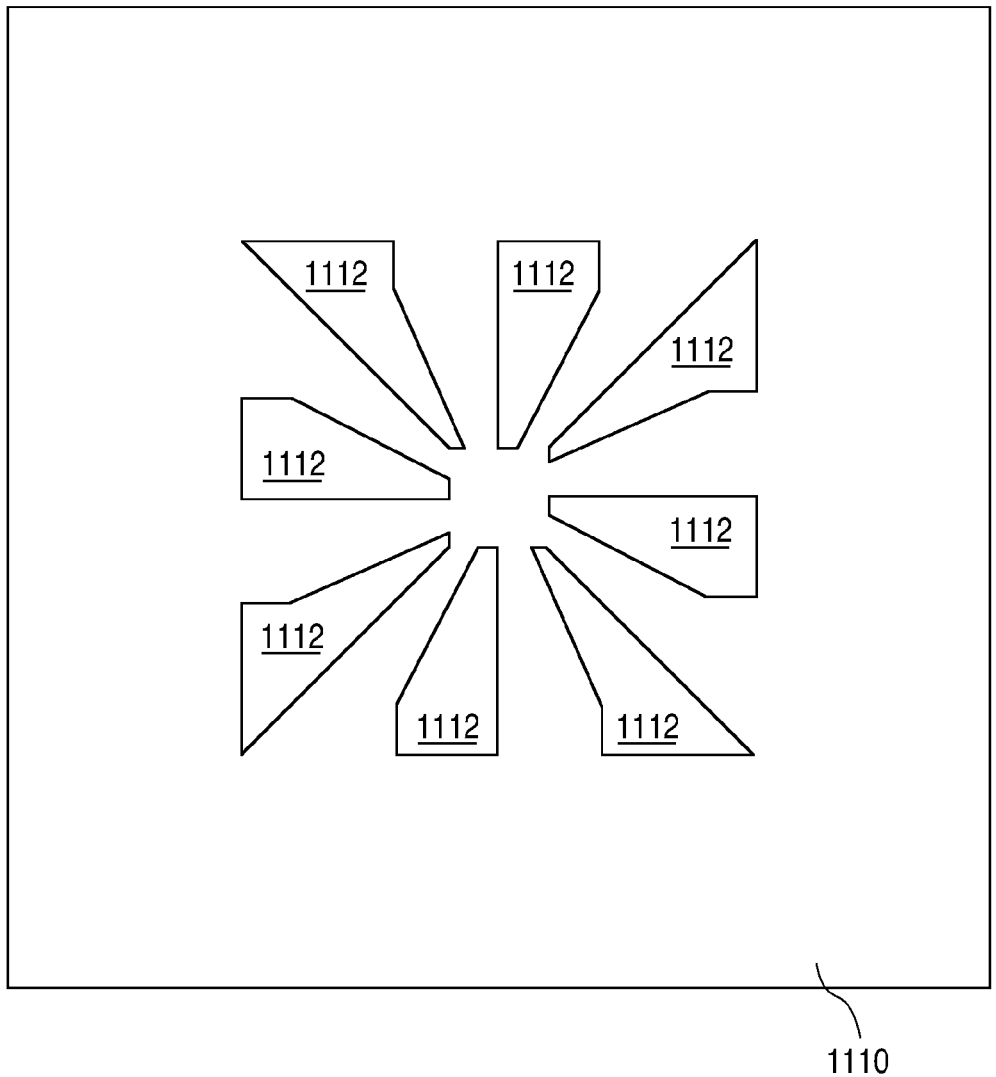

As shown in FIG. 11B, after patterned photoresist layer 1110 has been formed, the exposed regions of semiconductor structure 910 are implanted with a p-type dopant to form a pattern of p-type strips 1112 in lieu of forming p-type layer 924. Following the implant, patterned photoresist layer 1110 is removed in a conventional manner.

Thus, since structure 910 is n-type, the implant also forms a layer of alternating p-type and n-type strips. Alternately, a patterned photoresist layer can be formed on semiconductor structure 910 to expose the n-type regions that lie between the p-type strips 1112. After this, an n-type dopant can be implanted into the n-type regions that lie between the p-type strips 1112 to form a layer of alternating p-type and n-type strips. The patterned photoresist layer is then removed.

Figure 11C:
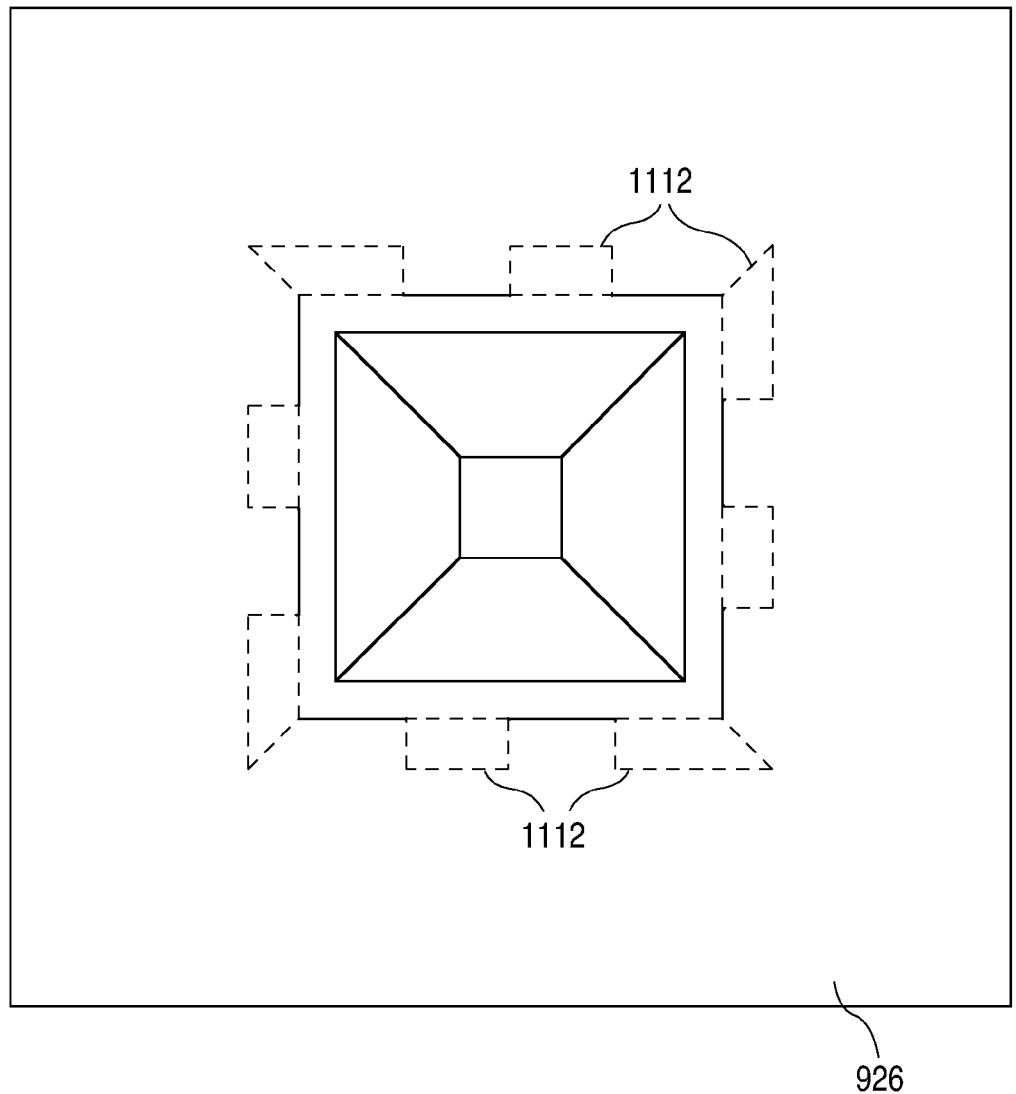
Figure 11D:
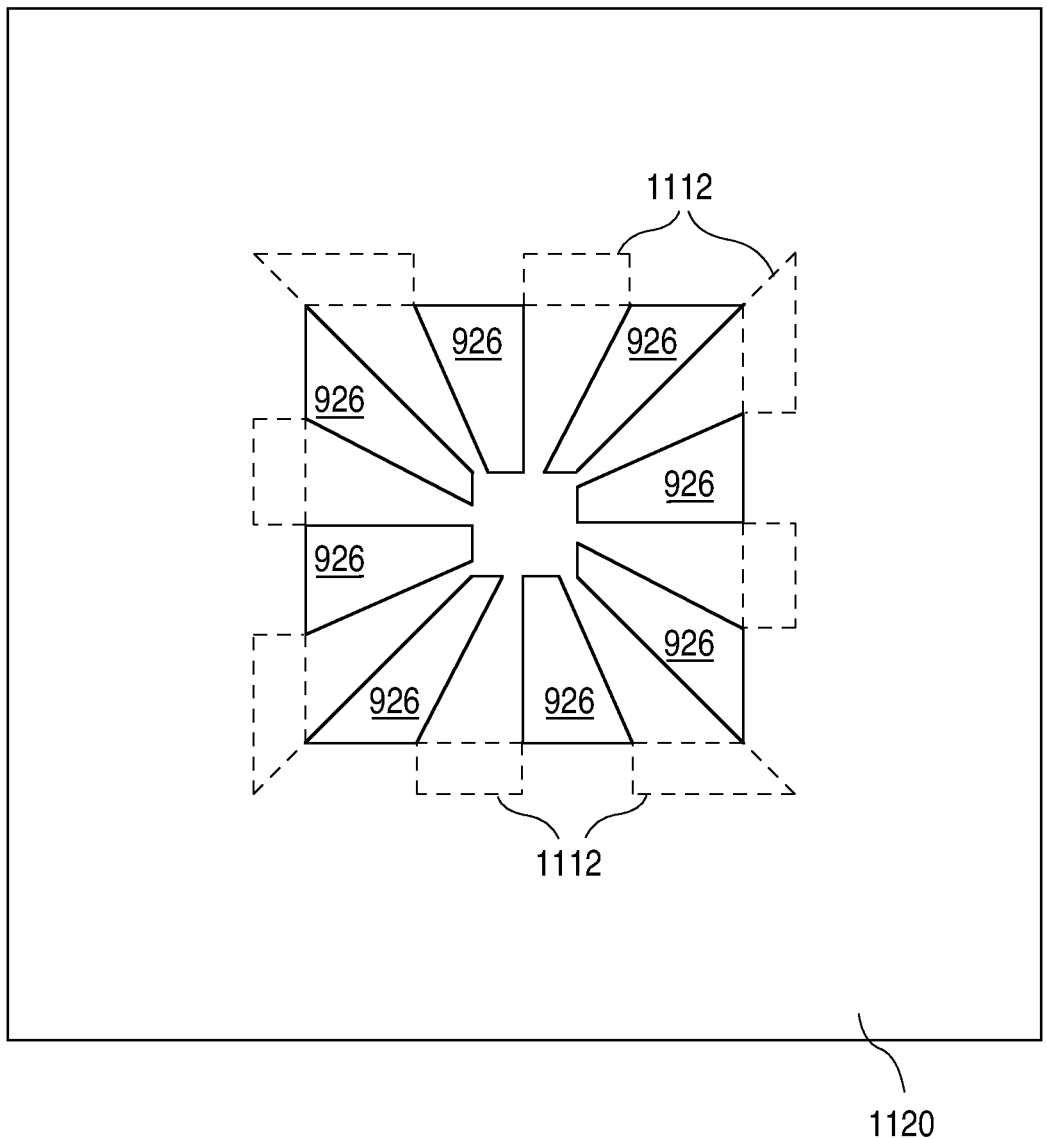

As shown in FIG. 11C, once the patterned photoresist layer has been removed, n-type epitaxial layer 926 is grown on structure 910 to line drain opening 914 in the same manner as in FIG. 9D. Following this, as shown in FIG. 11D, a patterned photoresist layer 1120 is formed on n-type epitaxial layer 926 in a conventional manner.

Figure 11E:
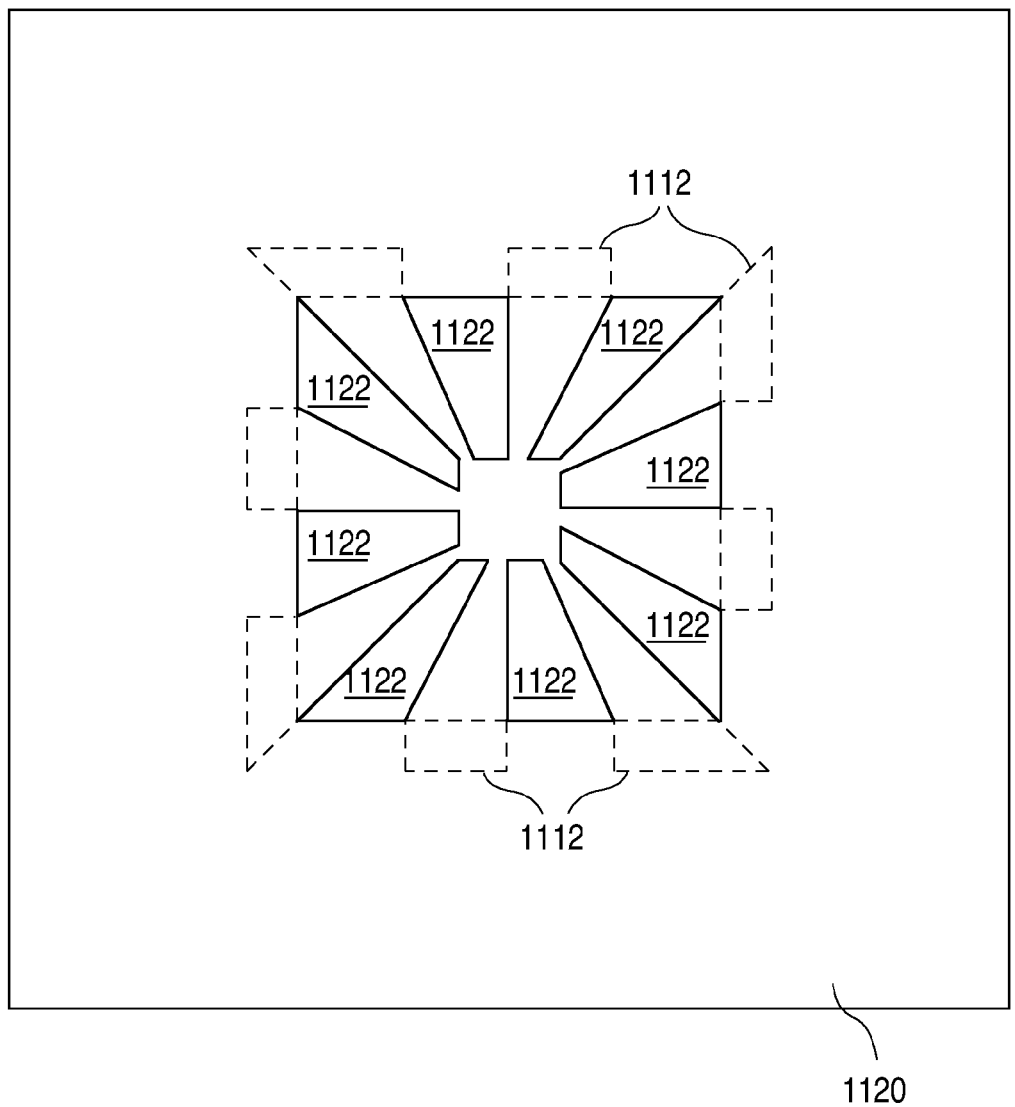

As shown in FIG. 11E, after patterned photoresist layer 1120 has been formed, the exposed regions of n-type epitaxial layer 926 are implanted with a p-type dopant to form a pattern of p-type strips 1122. Following the implant, patterned photoresist layer 1120 is removed in a conventional manner.

Thus, since epitaxial layer 926 is n-type, the implant also forms a layer of alternating p-type and n-type strips. Alternately, a patterned photoresist layer can be formed on n-type epitaxial layer 926 to expose the n-type regions that lie between the p-type strips 1122. After this, an n-type dopant can be implanted into the n-type regions that lie between the p-type strips 1122, followed by the removal of the patterned photoresist layer. Once the patterned photoresist layer has been removed, the method continues in the same manner as with transistor 200 with the formation of photoresist layer 930 on n-type epitaxial layer 926 and the p-type strips 1122.

DMOS transistor 500 can be formed in the same manner as DMOS transistor 400, except that patterned photoresist layer 1110 is modified to have a number of rod-shaped patterns, and no p-type material is implanted into n-type epitaxial layer 926. Similarly, DMOS transistor 600 can be formed in the same manner as DMOS transistor 400, except that patterned photoresist layer 1110 is modified to have a number of sphere-shaped patterns, and no p-type material is implanted into n-type epitaxial layer 926.

In addition, DMOS transistor 700 can be formed in the same manner that DMOS transistor 200 is formed, except that the formation of isolation layer 934 shown in FIG. 9F is omitted, and the pattern in patterned photoresist layer 956 is adjusted to allow a portion of gate 960 to extend partially into opening 914.

Further, DMOS transistor 800 can be formed in the same manner as DMOS transistor 200, except that backside contact 812 is formed in lieu of drain contact 246. Backside contact 812, in turn, can be formed by performing any necessary backgrinding, forming an opening in the backside of semiconductor structure 910 to expose n+ drain region 220, lining the opening with a non-conductive material, etching to again expose n+ drain region 220, and forming drain metal contact 812 in the opening to make an electrical connection with n+ drain region 220.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A DMOS transistor comprising:
a semiconductor structure having:
a top surface of a semiconductor substrate;
a rectangular shaped opening that extends from the top surface into the semiconductor structure, the opening having a bottom surface and a side wall surface, wherein the side wall surface is slanted;
a drain region of a first conductivity type that touches the bottom surface of the opening;
a body region of a second conductivity type that touches the top surface;
a drift structure that touches the side wall surface of the opening, the drift structure having a first region of the first conductivity type and a second region of the second conductivity type, the first region directly touching the drain region and having a first region surface that lies substantially in parallel with the side wall surface of the opening, the second region separated from the drain region by a portion of the semiconductor substrate, the second region touching the body region and having a second region surface that touches the first region surface;
a source region of the first conductivity type that touches the body region;
a channel region in the top surface of the body region that lies horizontally between and touches the drift structure and the source region;
a non-conductive region that fills the rectangular shaped opening; and
a metal drain contact that extends through the non-conductive region to the top surface, contacting and connecting to the drain region.

2. The DMOS transistor of claim 1 and further comprising:
a non-conductive structure that touches and lies above the channel region of the body region; and
a gate that touches the non-conductive structure and lies over the channel region of the body region.

3. The DMOS transistor of claim 2 wherein a portion of the gate lies within the opening.

4. The DMOS transistor of claim 1 wherein the first region of the drift structure is an epitaxial layer that touches the side wall surface of the opening.

5. The DMOS transistor of claim 1 wherein the drift structure includes a third region of the second conductivity type that touches the first region, and a fourth region of the first conductivity type that touches the third region.

6. The DMOS transistor of claim 5 wherein the third region and the fourth region of the drift structure are epitaxial layers.

7. A DMOS transistor comprising:
a semiconductor structure having:
a top surface of a semiconductor substrate;
a rectangular shaped opening that extends from the top surface into the semiconductor structure, the opening having a bottom surface and a side wall surface, wherein the side wall surface is slanted;
a drain region of a first conductivity type that touches the bottom surface of the opening;
a body region of a second conductivity type that touches the top surface;
a drift structure that touches the side wall surface of the opening, the drift structure having a plurality of spaced-apart first regions of the first conductivity type and a plurality of spaced-apart second regions of the second conductivity type, each first region directly touching the drain region and having a first region surface that lies substantially in parallel with the side wall surface of the opening, each second region separated from the drain region by a portion of the semiconductor substrate, the second region touching the body region and having a second region surface that touches the first region surface;
a source region of the first conductivity type that touches the body region;

a channel region in the top surface of the body region that lies horizontally between and touches the drift structure and the source region;

a non-conductive region that fills the rectangular shaped opening; and a metal drain contact that extends through the non-conductive region to the top surface, contacting and connecting to the drain region.

8. The DMOS transistor of claim 7 and further comprising:

a non-conductive structure that touches and lies above the channel region of the body region; and a gate that touches the non-conductive structure and lies over the channel region of the body region.

9. The DMOS transistor of claim 7 wherein the drift structure further includes a plurality of spaced-apart third regions of the second conductivity type that lie between and touch the plurality of spaced-apart first regions, each third region touching the drain region and having a third region surface that lies substantially in parallel with the side wall surface of the opening.

\* \* \* \* \*